(12) United States Patent
Sakaguchi et al.

(10) Patent No.: US 7,486,100 B2
(45) Date of Patent: Feb. 3, 2009

(54) ACTIVE MATRIX PANEL INSPECTION DEVICE AND INSPECTION METHOD

(75) Inventors: Yoshitami Sakaguchi, Hadano (JP); Daiju Nakano, Sagamihara (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/556,497

(22) PCT Filed: Apr. 28, 2004

(86) PCT No.: PCT/JP2004/006235

§ 371 (c)(1), (2), (4) Date: Sep. 19, 2006

(87) PCT Pub. No.: WO2004/100110

PCT Pub. Date: Nov. 18, 2004

(65) Prior Publication Data

US 2007/0040548 A1 Feb. 22, 2007

(30) Foreign Application Priority Data

May 12, 2003 (JP) ............................. 2003-133611

(51) Int. Cl.
*G01R 31/00* (2006.01)
(52) U.S. Cl. ...................................................... 324/770
(58) Field of Classification Search .................. 324/770
See application file for complete search history.

(56) References Cited

U.S. PATENT DOCUMENTS

| | | | | |
|---|---|---|---|---|
| 4,973,910 A | * | 11/1990 | Wilson | 324/457 |
| 5,428,300 A | * | 6/1995 | Takahashi et al. | 324/770 |
| 5,537,054 A | * | 7/1996 | Suzuki et al. | 324/770 |
| 5,576,730 A | * | 11/1996 | Shimada et al. | 345/98 |
| 6,768,480 B2 | * | 7/2004 | Jinno | 345/80 |
| 6,791,350 B2 | * | 9/2004 | Taguchi | 324/770 |
| 7,106,089 B2 | * | 9/2006 | Nakano et al. | 324/770 |
| 7,388,397 B2 | * | 6/2008 | Tomita | 324/770 |

FOREIGN PATENT DOCUMENTS

| | | |
|---|---|---|
| JP | 2002-040082 | 2/2002 |
| JP | 2002-108243 | 4/2002 |
| JP | 2002-297053 | 10/2002 |

\* cited by examiner

*Primary Examiner*—Ha Tran T Nguyen
*Assistant Examiner*—Richard Isla Rodas
(74) *Attorney, Agent, or Firm*—Vazken Alexanian

(57) ABSTRACT

An inspection method includes an array process of forming a TFT array on a substrate to fabricate an active matrix panel, an inspection process of carrying out performance inspection of the fabricated active matrix panel, and a cell process of mounting an OLED on the active matrix panel judged as non-defective in the inspection process. In the inspection process, a counter electrode is disposed in the vicinity of a plane, where an OLED connection electrode is exposed, of the active matrix panel fabricated in the array process so as to observe an electric current flowing on a pixel subject to measurement which constitutes the active matrix panel.

6 Claims, 21 Drawing Sheets

AMOLED TFT circuit with capacitance, Cm (b) AMOLED TFT circuit with capacitance, Cm (a) AMOLED pixel circuit

ACTIVE MATRIX PANEL INSPECTION DEVICE AND INSPECTION METHOD

CROSS REFERENCE and PRIORITY

This application filed under 35 USC 371, is cross-referenced with, and claims priority from, International Patent Application JP2004/006235 filed on Apr. 28, 2004, and published with Publication No. PCT WO 2004/100110 on Nov. 18, 2004, under PCT article 21(2), which in turn claims priority of JP 2003-133611 filed on May 12, 2003.

BACKGROUND OF THE INVENTION

The present invention relates to an inspection device and the like for an active matrix organic light emitting diode (OLED) panel, and more specifically to an inspection device for conducting performance inspection of a thin film transistor (TFT) array prior to an OLED formation process.

An OLED (also referred to as organic electro luminescence (EL)) is for conducting a direct current on a fluorescent organic compound which is excited by application of an electric field, and thereby causing light emission of the compound. The OLED is drawing attention as a next-generation display device in terms of low-profileness, a wide view angle, and a wide gamut, etc. Whereas a driving method for the OLED includes a passive type and an active type, the active type is suitable for achieving a large-screen and high-definition display in light of aspects involving a material, a life, and crosstalks. This active type requires thin film transistor (TFT) driving, and a TFT array applying low-temperature polysilicon or amorphous silicon (a-Si) is drawing attention for this use.

There have been a conventional inspection method for a TFT array in a liquid crystal display (LCD). The method is configured to observe electric charges accumulated in a pixel capacitor by use of an integration circuit after writing a voltage in the pixel capacitor and thereby to inspect whether the voltage is written properly (see Patent Reference 1, for example). Meanwhile, there is disclosed a method to optically inspect writing in a pixel capacitor by use of a photoelectric element (see Patent Reference 2, for example). Moreover, there is also disclosed a method of inspecting writing by means of measuring electric potential of a pixels electrode simultaneously with conducting an electric current on the pixel electrode by an electron beam.

[Patent Reference 1]
U.S. Pat. No. 5,179,345 (Pages 3 to 5, FIG. 2)
[Patent Reference 2]
U.S. Pat. No. 4,983,911 (Pages 2 to 4, FIGS. 1 to 3)

Now, description will be made on comparison between an active matrix OLED (AMOLED) and an active matrix liquid crystal display (AMLCD). FIGS. 21A and 21B are diagrams for comparing and explaining pixel circuits in the AMOLED and the AMLCD. FIG. 21A shows a pixel circuit of the AMOLED and FIG. 21B shows a pixel circuit of the AMLCD. In FIG. 21B, the pixel circuit of a TFT array is formed by a TFT 310 which is connected to a data line (Data) and a gate line (Gate) Meanwhile, in the AMOLED shown in FIG. 21A, a driving TFT 302 which is an open drain driving transistor is connected adjacently to a pixel capacitor of a circuit similar to the one shown in FIG. 21B, and an OLED 301 which is a light emitting element is connected to the driving TFT 302.

The AMLCD can change gradation only by generating a voltage on the TFT 310. By contrast, in the AMOLED, luminance of the OLED 301 is changed in response to a value of an electric current flowing thereon when a predetermined voltage is applied to the driving TFT 302. Unevenness may be caused to threshold voltages Vth of these driving TFTs 302 even if a process is adjusted. When the threshold voltages are uneven, the electric currents flowing on the TFTs may vary even if the same voltage is applied thereto, and uneven luminance may occur. Accordingly, in the performance inspection of a TFT array for an AMOLED panel, in addition to inspection of open/short defects in the wiring, it is important to inspect whether characteristics of the driving TFTs 302 for driving the OLEDs 301 are uniform over the entire panel. Such inspection of uniformity corresponds to confirmation of uniformity in the threshold voltages Vth among the driving TFTs 302 on the panel owing to functions of compensation circuits for the driving TFTs 302.

Here, in order to reduce manufacturing costs of the current AMOLED panels, it is necessary to carry out a performance test on the independent TFT array and forward only a nondefective product to a subsequent process. It is desired to measure the threshold voltage Vth of the driving TFT 302 prior to mounting the OLED 301 in the manufacture of the AMOLED panel due to the reasons that: a product yield of the current TFT arrays for the AMOLED panels is not sufficiently high; raw material costs of the OLED 301 are high; a process for forming the OLED 301 occupies relatively a long time in the entire manufacturing process; and so on. Moreover, prior to mounting the OLED 301, it is required to confirm an etching condition of a pixel electrode subject to etching so that the TFT array having an etching defect is removed before forming the OLED 301.

However, in the independent TFT array, the OLED which is a constituent of the pixel circuit is not mounted, and the driving TFT is set to an open-drain state. That is, in the process prior to mounting the OLED, the OLED 301 indicated by broken lines in FIG. 21A is not connected and a normal circuit is not therefore established. Accordingly, it is basically impossible to conduct an electric current on the driving TFT 302, and it is not possible to carry out the performance inspection of the Vth compensation circuits, the performance inspection of the TFT array, or the inspection of patterning conditions of the pixel electrode if nothing is done.

Patent References 1 and 2 described above solely show the methods of inspecting the pixel circuit of the TFT array for the AMLCD as shown in FIG. 21B and do not possess a mechanism for supplying an electric current to the driving TFT 302 shown in FIG. 21A. As a result, it is not possible to perform the Vth measurement of the driving TFT 302 set to the open-drain state by use of the techniques disclosed in Patent References 1 and 2. Moreover, a method of carrying out inspection by means of connecting wiring to a drain of a driving TFT and conducting an electric current thereon is also conceivable. However, such a method seems unrealistic because there is a risk of contamination or damage of a TFT array by such wiring connection.

SUMMARY OF THE INVENTION

The present invention has been made to solve the foregoing technical problems. It is an object of the present invention to carry out performance inspection of a TFT array for an AMOLED panel prior to a process for forming an OLED.

Another object of the present invention is to carry out performance inspection of a TFT array for an AMOLED panel without preparing a special additional circuit in a pixel.

Still another object of the present invention is to carry out performance inspection of a Vth compensation circuit of a driving TFT, inspection of unevenness in Vth values, or inspection of a patterning condition of a pixel electrode without connecting a current-supplying terminal to a drain electrode of a driving TFT.

To attain the objects, an inspection device for an active matrix panel (a TFT array) applying the present invention includes: a counter electrode disposed in the vicinity of a plane, where an OLED connection electrode is exposed, of an active matrix panel prior to formation of an organic light emitting diode (OLED); minute capacitance forming means for forming minute capacitance Cm between the OLED connection electrode of a driving thin film transistor (TFT) constituting the active matrix panel and a power source by use of the counter electrode; inspecting means for inspecting the active matrix panel based on the minute capacitance Cm formed by the minute capacitance forming means; and pinch-off voltage estimating means for configuring a charge pump circuit using a pixel capacitor Cs existing in a pixel circuit and the minute capacitance Cm and for estimating a pinch-off voltage Vp after compensation of a threshold voltage Vth.

Here, the inspecting means is configured to inspect the active matrix panel by estimating the threshold voltage Vth of the driving TFT. To be more specific, the inspecting means estimates the threshold voltage Vth of the driving TFT by changing a voltage from the power source in an amount equivalent to a given potential difference, then conducting a transient current between a drain and a source of the driving TFT through the minute capacitance Cm formed by the minute capacitance forming means, and then observing a current waveform which is outputted from the driving TFT. Moreover, it is also possible to configure the inspecting means to observe a charge amount that flew by use of an integration circuit disposed on the source side of the driving TFT, and to estimate the threshold voltage Vth based on the minute capacitance Cm and the given potential difference.

Meanwhile, the inspecting means may be configured to estimate the minute capacitance Cm of each of the pixels constituting the active matrix panel and to evaluate unevenness in the minute capacitance Cm among the pixels. Moreover, assuming that the potential difference of the power source voltage is Vd, the charge amount flowing through the integration circuit disposed on the source side of the driving TFT until a time point of pinch-off is Qp, and the minute capacitance is Cm, then the inspecting means may be configured to calculate a pinch-off voltage by use of an equation Vp=Vd−Qp/Cm, and to inspect the active matrix panel based on the calculated pinch-off voltage Vp.

Another aspect of the present invention is an inspection method for an active matrix panel configured to inspect an active matrix panel prior to formation of an OLED, which includes the steps of: disposing a counter electrode in the vicinity of a plane, where an OLED connection electrode is exposed, of an active matrix panel; selecting a pixel subject to measurement in the active matrix panel; setting a power source connected to the counter electrode to driving potential and applying a given voltage Vd between a drain and a source of a driving TFT of the pixel subject to measurement; and observing an electric current which flows on the driving TFT of the pixel subject to measurement.

Here, it is preferable if the method further includes the steps of estimating the minute capacitance Cm to be formed between the counter electrode and the driving TFT, and specifying a defective part in the active matrix panel based on the estimated minute capacitance Cm. Particularly, it is preferable when the step of specifying a defective part is configured to specify the defective part based on judgment as to whether the estimated minute capacitance Cm exceeds a predetermined range, because the inspection method can easily discover a defect caused by a decrease in the area of a pixel attributable to excessive etching or a short circuit between adjacent pixel electrodes attributable to insufficient etching.

Moreover, it is preferable if the inspection method further includes the steps of estimating a threshold voltage Vth of the driving TFT, and specifying a defective part in the active matrix panel based on the estimated threshold voltage Vth, because the method can evaluate the driving TFT for driving an OLED by use of the independent TFT array.

Moreover, the step of estimating a threshold voltage Vth may be configured to observe a charge amount that flew by use of an integration circuit disposed on the source side of the driving TFT, and to estimate the threshold voltage Vth by obtaining a pinch-off voltage Vp from the charge amount that the driving TFT flew until reaching a pinch-off state. In addition, the inspection method may further include the step of obtaining any of the threshold voltage Vth and the pinch-off voltage Vp with respect to pixels constituting the active matrix panel and judging whether the active matrix panel is defective based on any of a voltage range and unevenness of any of the threshold voltage Vth and the pinch-off voltage Vp.

From another point of view, a manufacturing method for an active matrix OLED panel applying the present invention includes an array process of forming a TFT array on a substrate and thereby fabricating an active matrix panel, an inspection process of inspecting a performance of the fabricated active matrix panel, and a cell process of mounting an OLED on the active matrix panel which is judged as non-defective in the inspection process. Here, the inspection process is configured to dispose a counter electrode in the vicinity of a plane, where an OLED connection electrode is exposed, of an active matrix panel fabricated in the array process, and to observe an electric current flowing on a pixel subject to measurement which constitutes the active matrix panel.

Here, the inspection process may be configured to inspect the performance of the active matrix panel by disposing the counter electrode to form minute capacitance Cm between a drain of a driving TFT constituting the active matrix panel and a power source, conducting a transient current on the driving TFT through the minute capacitance Cm, and observing an output waveform from the driving TFT. Specifically, it is possible to determine a defective part of a pixel electrode by estimating the minute capacitance Cm of each of the pixels constituting the active matrix panel and evaluating unevenness in the minute capacitance Cm among the pixels. Moreover, the inspection process may be configured to inspect the performance of the active matrix panel by observing the output waveform from the driving TFT and estimating a threshold voltage Vth of the driving TFT. Furthermore, the inspection process may be configured to dispose an integration circuit on a source side of the driving TFT so as to calculate a pinch-off voltage Vp based on a charge amount flowing on the integration circuit, and to judge whether the active matrix panel is defective based on any of the threshold voltage Vth and the pinch-off voltage Vp with respect to the pixels constituting the active matrix panel. In addition, the inspection method may be configured to obtain a saturation current when a given voltage is applied to the driving TFT with respect to all pixels on the active matrix panel and to evaluate unevenness in characteristics depending on the driving TFTs.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE EMBODIMENT

Now, the present invention will be described in detail based on an embodiment with reference to the accompanying drawings.

Figure 1:
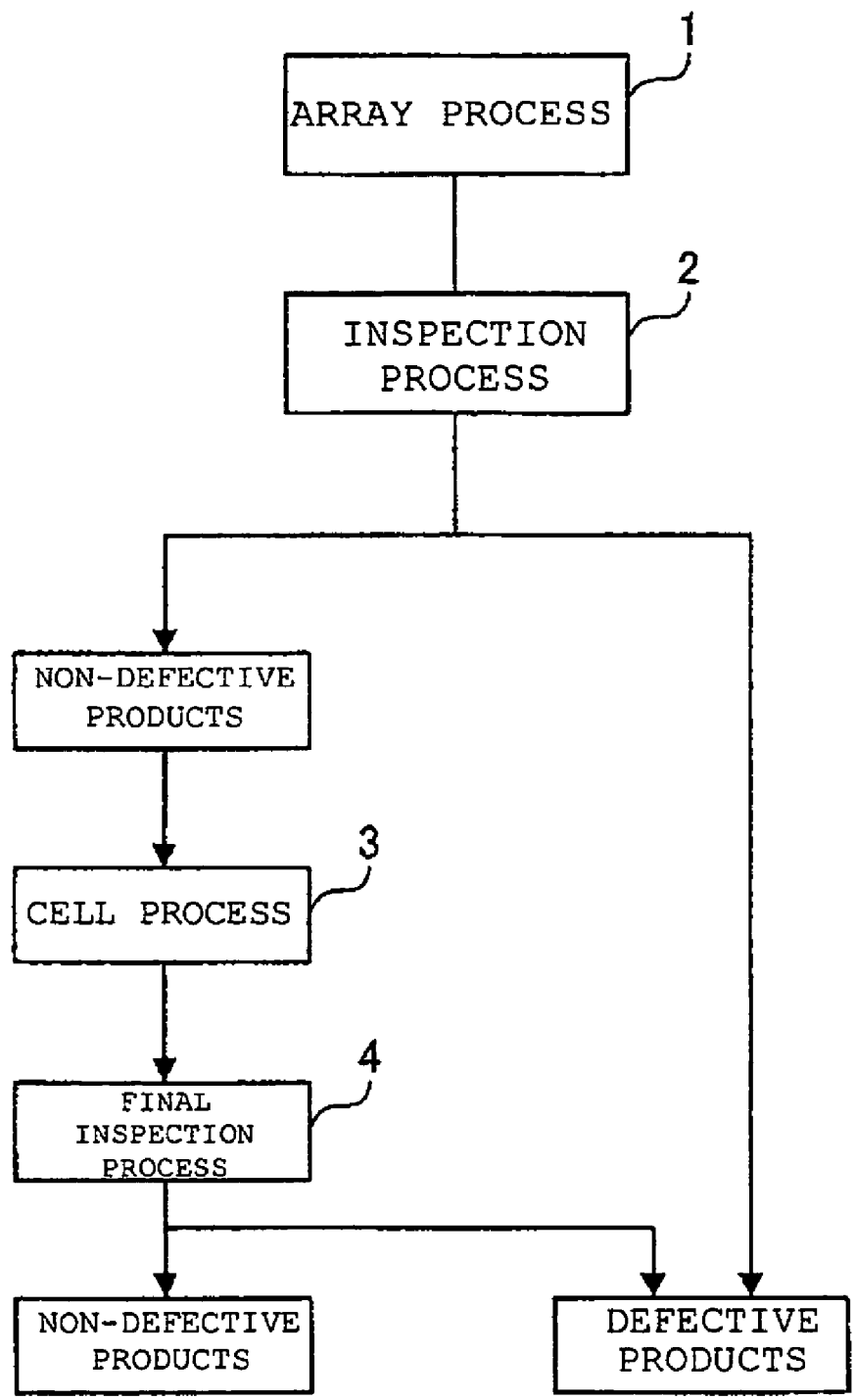
FIG. 1 is a view for explaining a manufacturing process of an OLED panel applying an embodiment of the present invention.

FIG. 1 is a view for explaining a manufacturing process of an organic light emitting diode (OLED) panel applying an embodiment of the present invention. The manufacturing method for an OLED panel applying the embodiment includes an array process 1 of fabricating a thin film transistor (TFT) array (an active matrix panel) which is a driving circuit for the OLED, and an inspection process 2 of carrying out a performance test on the independent TFT array thus fabricated. In the inspection process 2, the inspection is carried out so as to check whether open/short defects of wiring are below a predetermined condition and whether characteristics of the TFTs are uniform throughout the panel. A TFT array judged as a defective product in this inspection process 2 will not be forwarded to a subsequent process but removed instead. A TFT array judged as a non-defective product will be forwarded to a cell process 3 of forming the OLED on the TFT array and then to a final inspection process 4. In this final inspection process 4, products will be finally sorted into non-defective products and defective products. In this embodiment, the inspection process 2 is provided prior to the cell process 3. Accordingly, it is possible to remove TFT arrays having uneven driving TFTs prior to mounting the OLED. Objects of such inspection include active matrix (AM) panels used as display screens for personal handy phone systems (PHS) and cellular phones, etc., and various active matrix OLED (AMOLED) panels.

Now, the inspection process 2 will be described in detail.

Figure 2:
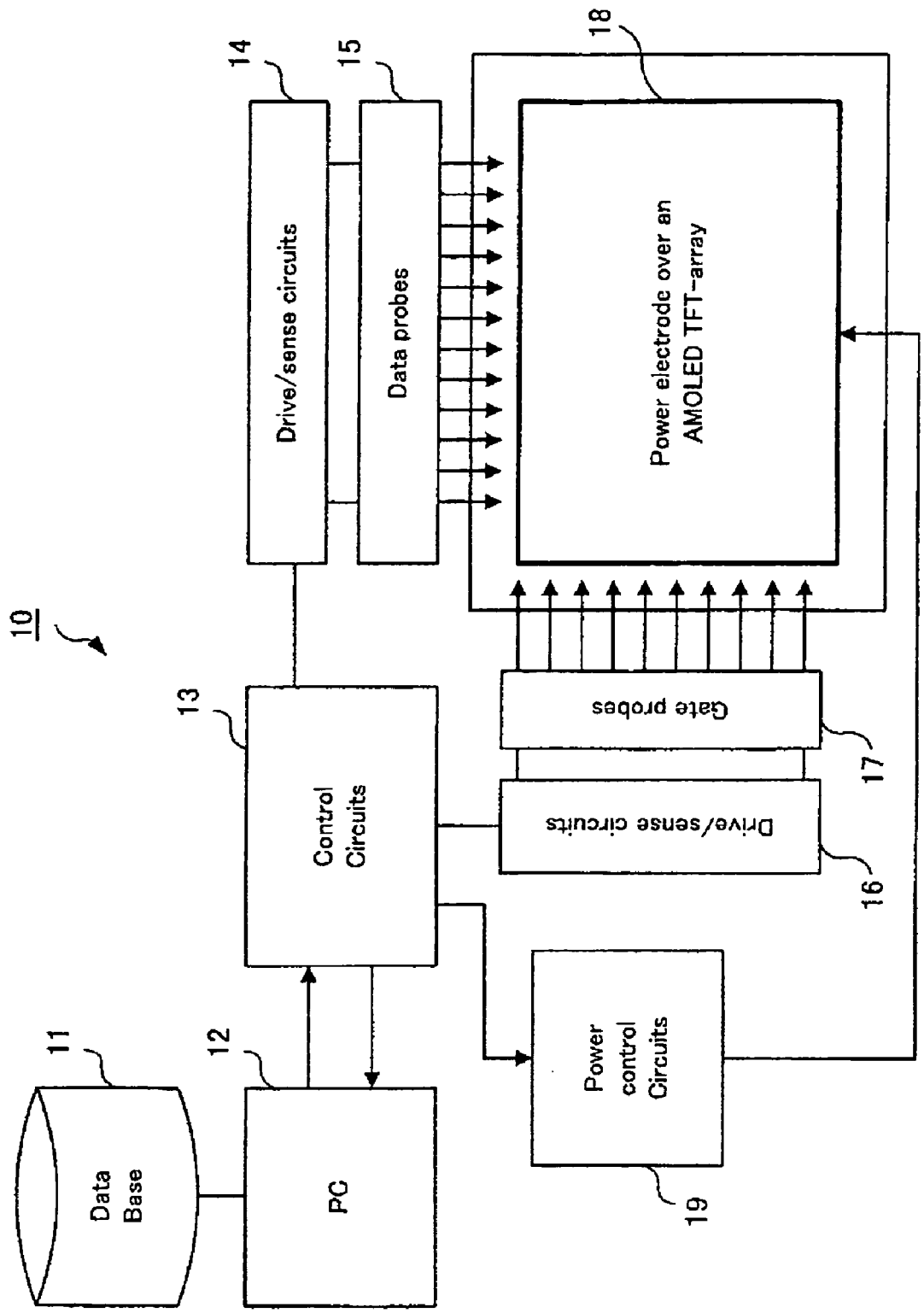
FIG. 2 is a view for explaining a configuration of a test device used in an inspection process.

FIG. 2 is a view for explaining a configuration of a test device 10 used in the inspection process 2. The test device 10 includes a storage device (Data Base) 11, a computer (PC) 12, measurement control circuits (Control Circuits) 13, signal generation and signal measurement circuits (Drive/sense circuits) 14, probes (Data probes) 15, signal generation and signal measurement circuits (Drive/sense circuits) 16, probes (Gate probes) 17, a counter electrode having minute capacitance (Power electrode) 18, and minute capacitance counter electrode control circuits (Power control Circuits) 19.

The storage device 11 of the test device 10 stores information necessary for judging whether a TFT array being an inspection object is defective or non-defective, and also stores information necessary for measurement. The computer 12 is comprised of a personal computer (PC), for example, and is configured to execute judgment processing in response to input data based on the information stored in the storage device 11. The measurement control circuits 13 manage measurement sequences of an inspection method to be described later. Meanwhile, the signal generation and signal measurement circuits 14 and 16 are analog circuits configured to generate driving signals for the AMOLED and to obtain measurement waveforms from the TFT array. Integration circuits to be described later are mounted on these signal generation and signal measurement circuits 14 and 16. The probes 15 and 17 supply the AMOLED driving signals generated by the signal generation and signal measurement circuits 14 and 16 to the TFT array which is a measurement object, and also obtain the measurement waveforms from the TFT array. The counter electrode 18 having the minute capacitance is disposed in the vicinity (at a distance of about 10 micrometers, for example) on a panel surface (a plane where an OLED connection electrode is exposed) of the TFT array which is the measurement object, and forms minute capacitance Cm between a drain of the driving TFT and a power source. The counter electrode 18 is made of a highly flat metal plate with low resistance such as a copper plate. Moreover, the minute capacitance counter electrode control circuit 19 controls a power supply voltage to be supplied to the counter electrode 18.

In the test device 10, the measurement sequences of the inspection method to be described later are managed by the measurement control circuits 13, and the AMOLED driving signals are generated by the signal generation and signal measurement circuits 14 and 16 and are supplied to the TFT array through the probes 15 and 17. Moreover, the measurement waveforms of the TFT array are inputted to the signal generation and signal measurement circuits 14 and 16 through the probes 15 and 17 for observation. The observed signals are converted into digital data by the measurement control circuits 13 and then inputted to the computer 12. The computer 12 performs processing of the measurement data and judgment of defective products while making reference to the information stored in the storage device 11.

Now, description will be made on the inspection method for the driving TFTs to be executed by use of the test device 10 in the inspection process 2.

Figure 3:
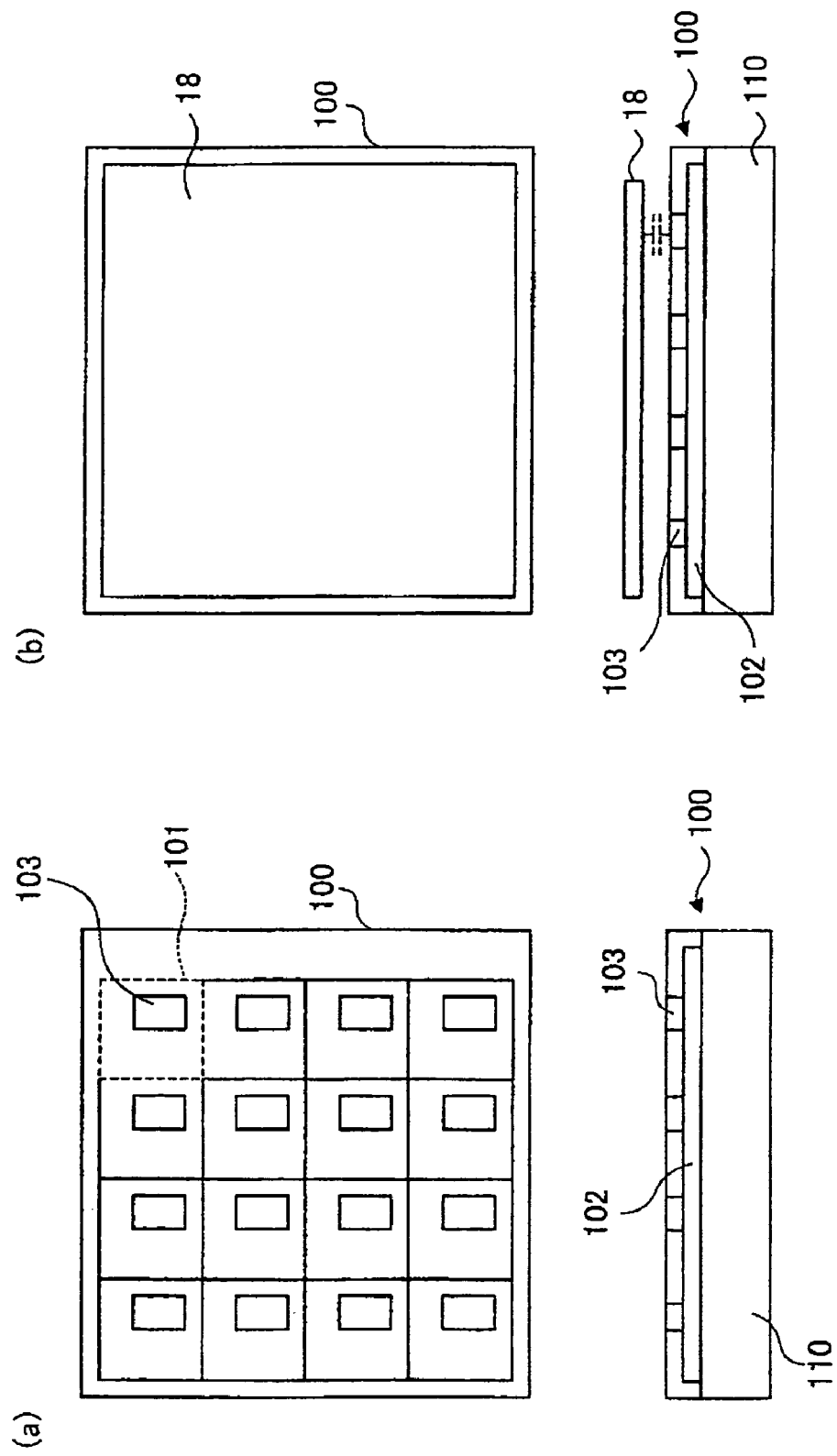
FIGS. 3A and 3B are views for explaining formation of minute capacitance Cm on a TFT array.

FIGS. 3A and 3B are views for explaining generation of the minute capacitance Cm on a TFT array (an active matrix panel). FIG. 3A shows the TFT array (the active matrix panel) 100 and FIG. 3B shows a state where the counter electrode 18 is disposed adjacently to the TFT array 100. In the TFT array 100, an aggregate of pixels 101 are formed on a substrate 110. TFTs 102 are formed so as to correspond to the respective pixels 101 and respective pixel electrodes are formed to correspond to the respective pixels 101. As shown in FIG. 3B, the counter electrode 18 connected to a power source is disposed in the vicinity of a surface (a plane where an OLED connection electrode is exposed) of the TFT array 100 which is an AMOLED panel, and the minute capacitance Cm is formed between a drain (the OLED connection electrode) of the driving TFT and the power source. It is conceivable that a high-accuracy distance sensor (not shown) or a spacer (not shown) for defining a distance to be formed on the counter electrode 18 side or the TFT array 100 side may be applied as counter electrode disposing means for approximating the counter electrode 18.

Figure 4:
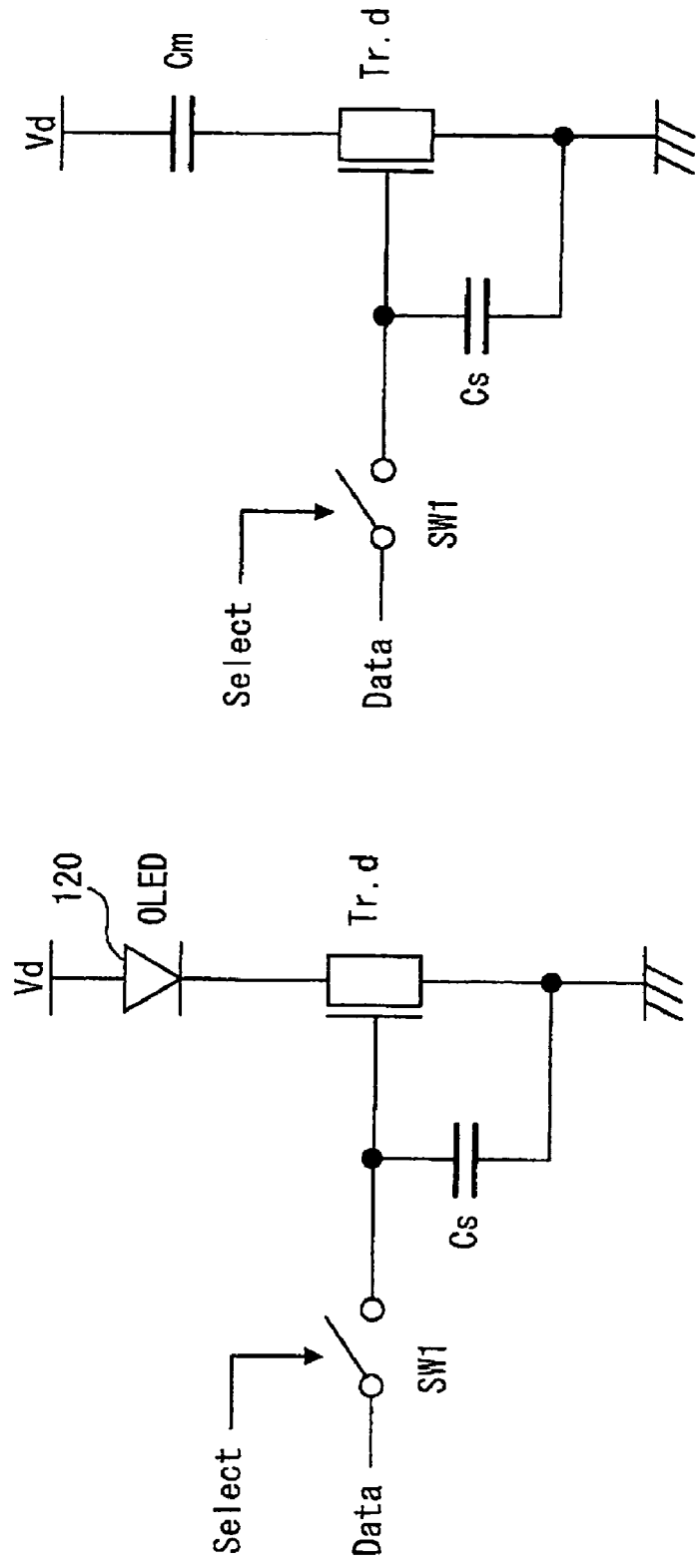
FIGS. 4A and 4B are views showing examples of a pixel circuits of a voltage programming mode which applies the simplest two-TFT structure.
Figure 5:
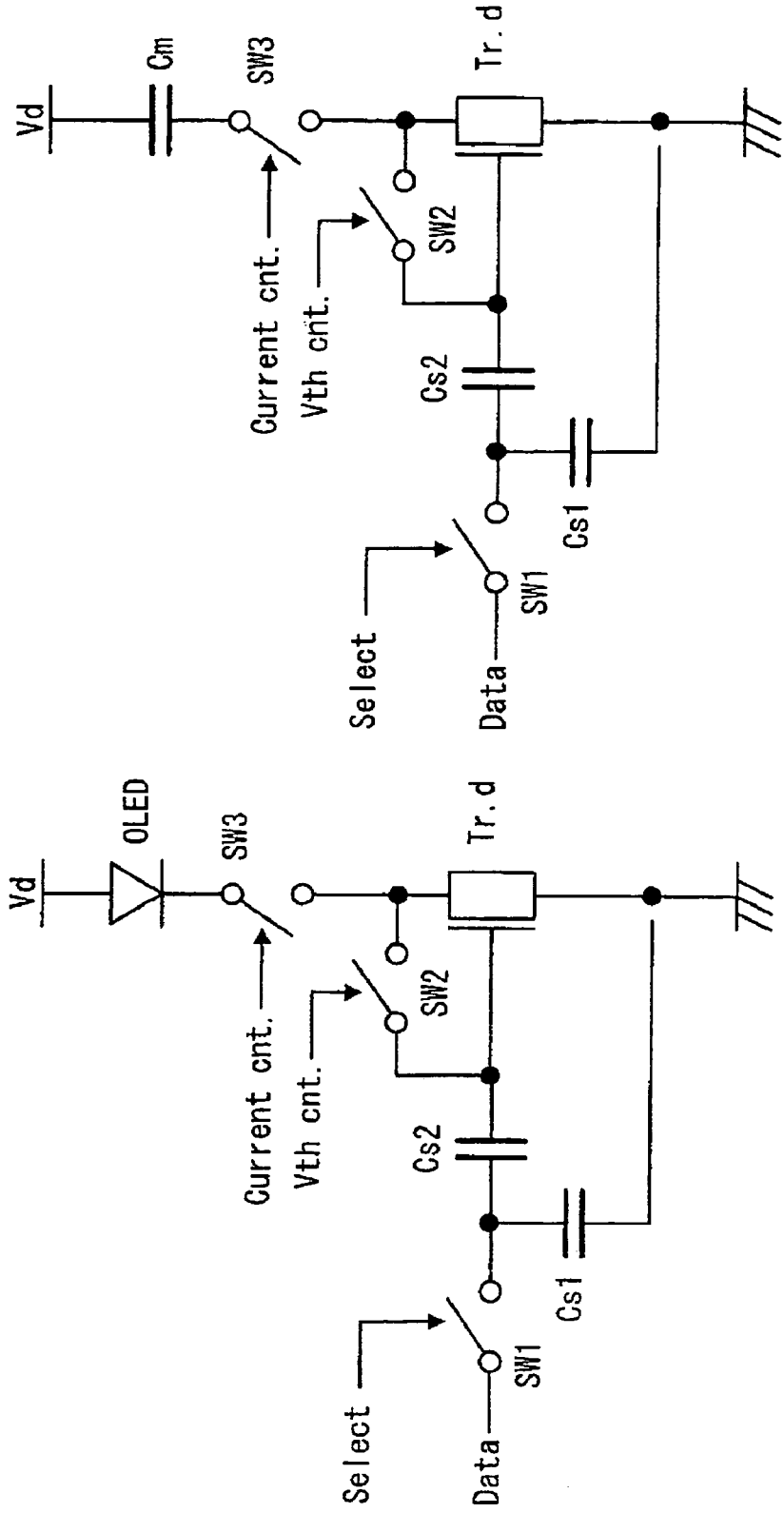
FIGS. 5A and 5B are views showing examples of pixel circuits of a voltage programming mode which applies a four-TFT structure incorporating a function for Vth compensation.
Figure 21:
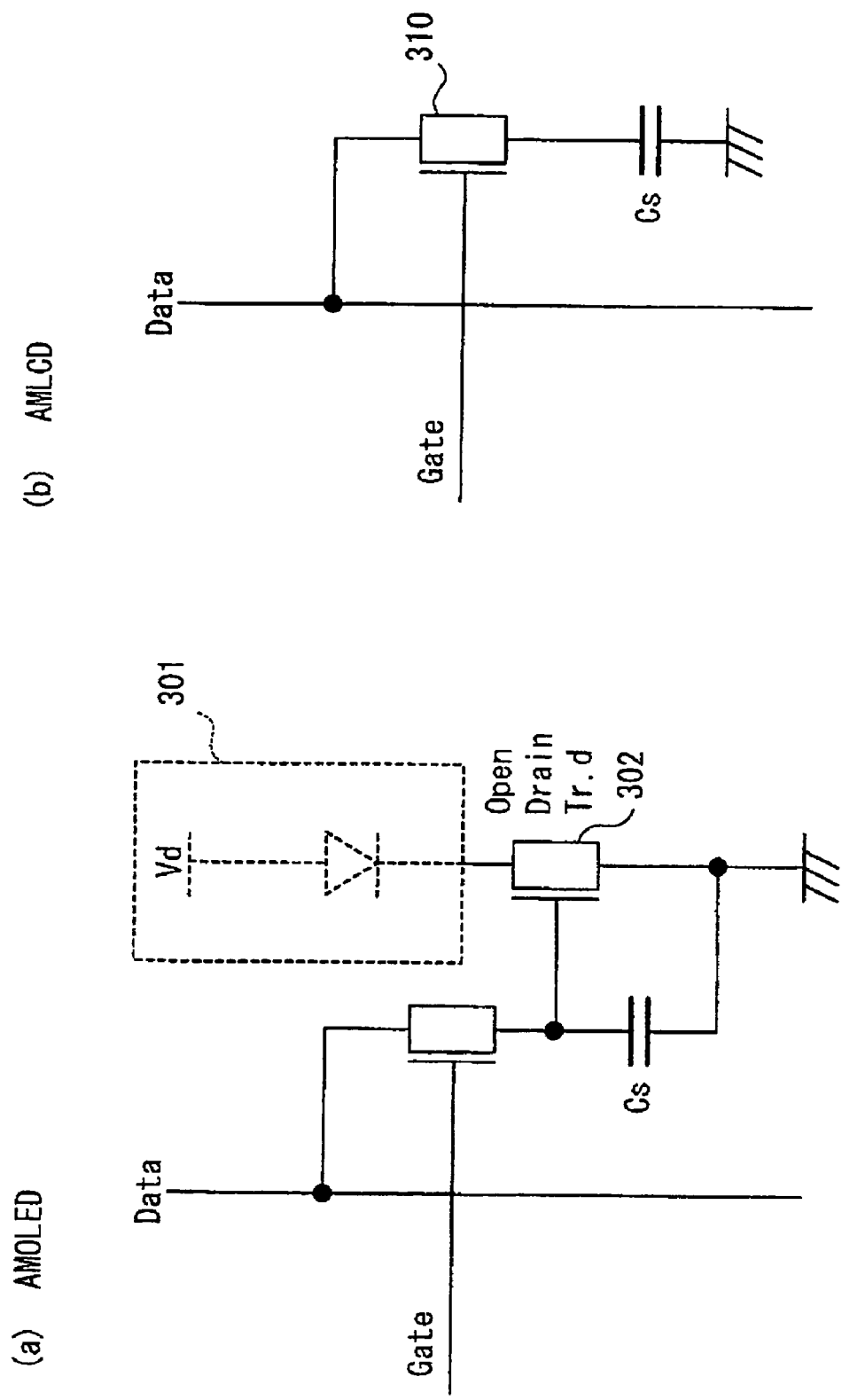
FIGS. 21A and 21B are diagrams for comparing and explaining pixel circuits in an AMOLED and an AMLCD.

FIG. 4A to FIG. 5B show examples of pixel circuits with the minute capacitance formed therein. FIGS. 4A and 4B show examples of pixel circuits of a voltage programming mode which apply the simplest two-TFT structure as shown in FIG. 21A. FIGS. 5A and 5B show examples of pixel circuits of a voltage programming mode which apply a four-TFT structure so as to incorporate a function of Vth compensation. Each of FIGS. 4A and 5A shows a state where an OLED 120 is mounted, and each of FIGS. 4B and 5B shows the pixel circuit in which the minute capacitance Cm is formed instead of mounting the OLED 120. In FIGS. 4A and 4B, a switch SW1 is turned on by a select line (Select) when writing a gray scale voltage into a pixel capacitor Cs. Meanwhile, reference numeral Tr. d denotes a driving TFT which represents an n-channel TFT herein. A switch SW1 shown in FIGS. 5A and 5B is turned on by a select line (Select) when writing a gray scale voltage into a pixel capacitor Cs1. Switches SW2 and SW3 constitute a circuit for carrying out the Vth compensation of the driving TFT (Tr. d). The switch SW2 is controlled by a Vth compensation control line (Vth cnt.) and the switch SW3 is controlled by a current switch control line (Current cnt.), whereby a threshold voltage Vth is stored in the pixel capacitor Cs2.

The threshold voltage Vth is a standard voltage when driving the OLED 120 with the TFT. Assuming that a voltage of about 1.5 V is defined as a preferable value of the threshold voltage Vth, for example, when the threshold voltage Vth is increased, a drain current value is reduced if a gate voltage Vgs of the same value is applied and a screen thereby becomes dark. Moreover, in a case of gradation display, a gray scale portion close to black is deteriorated. On the other hand, when the threshold voltage Vth is decreased, the drain current value is increased if the gate voltage Vgs of the same value is applied and the screen thereby becomes bright. Accordingly, in the inspection process 2, the threshold voltage Vth is estimated and the estimated threshold voltage Vth is used as an index for judging a defective panel.

Next, description will be made on processing to be executed in the inspection process 2.

This embodiment carries out inspection for the voltage programming pixel circuit without a Vth compensating function as shown in FIGS. 4A and 4B and for the voltage programming pixel circuit with the Vth compensating function as shown in FIGS. 5A and 5B. The pixel circuits shown in FIGS. 4A and 4B represent a typical configuration which allows setting of Vgs of the driving TFT directly from the data line (Data), and such a circuit is not limited only to the pixel circuits shown in FIGS. 4A and 4B. The pixel circuits shown in FIGS. 5A and 5B represent a typical configuration in which the minute capacitance Cm and the pixel capacitor Cs are connected through a Vth compensation control switch, and such a circuit is not limited only to the pixel circuits shown in FIGS. 5A and 5B. Here, in order to explain the principle of measurement, an offset voltage attributable to control signal driving is disregarded. The offset voltage will be taken into account in an example to be described later.

Figure 6:
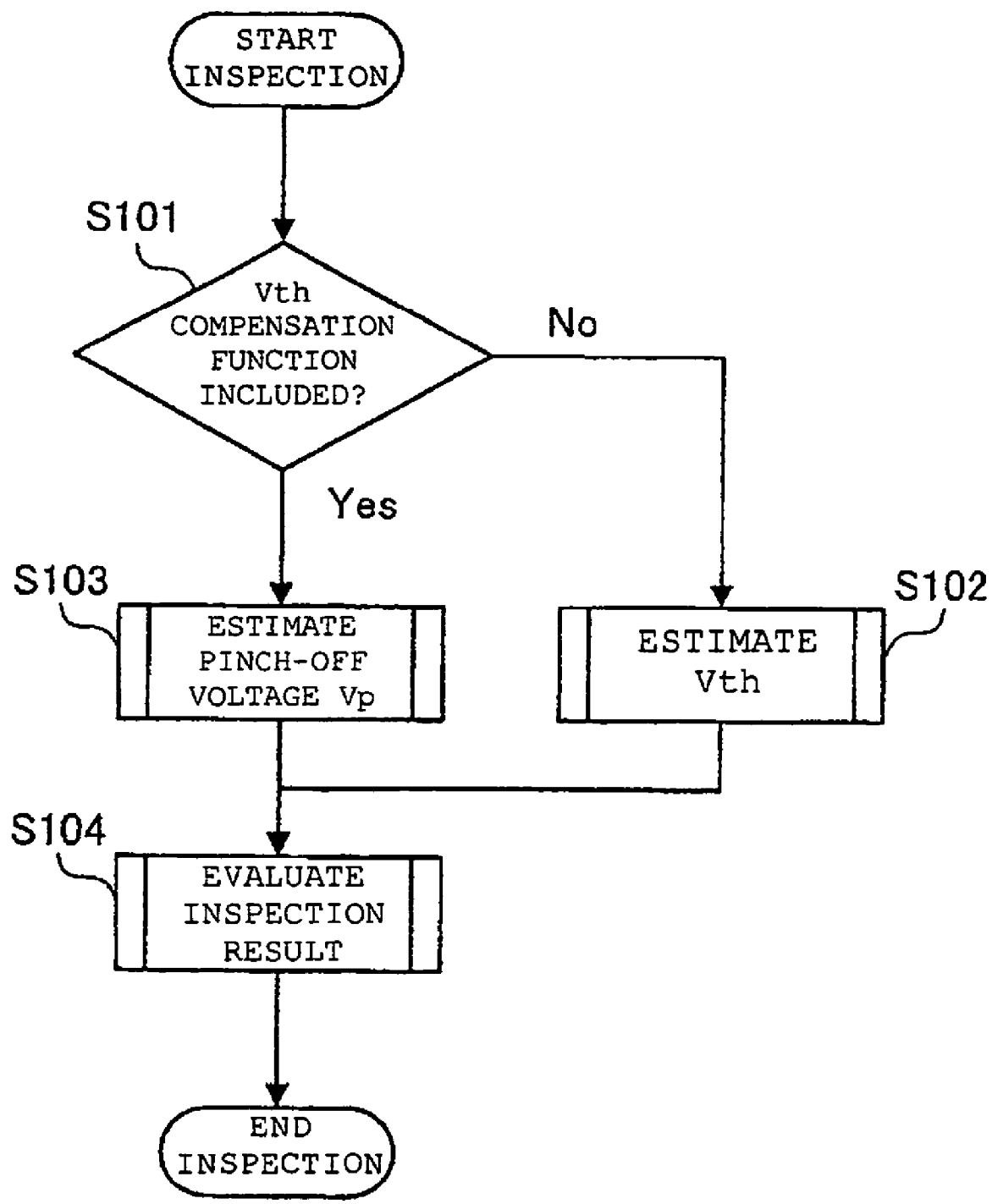
FIG. 6 is a flowchart showing a flow of measurement.

FIG. 6 is a flowchart showing a flow of measurement. At the start of inspection, judgment is first made as to whether a pixel circuit includes a function for compensating a threshold voltage Vth (Step S101). When the circuit does not include the Vth compensating function, processing for estimating Vth is executed (Step S102). When the circuit includes the Vth compensating function as shown in FIG. 5B, the threshold voltage Vth is set by charge pumping and then processing for estimating Vth which cannot be compensated (a pinch-off voltage Vp) is executed (Step S103). After the processing mentioned above, processing for evaluating an inspection result is executed (Step S104) and the inspection is completed.

Figure 7:
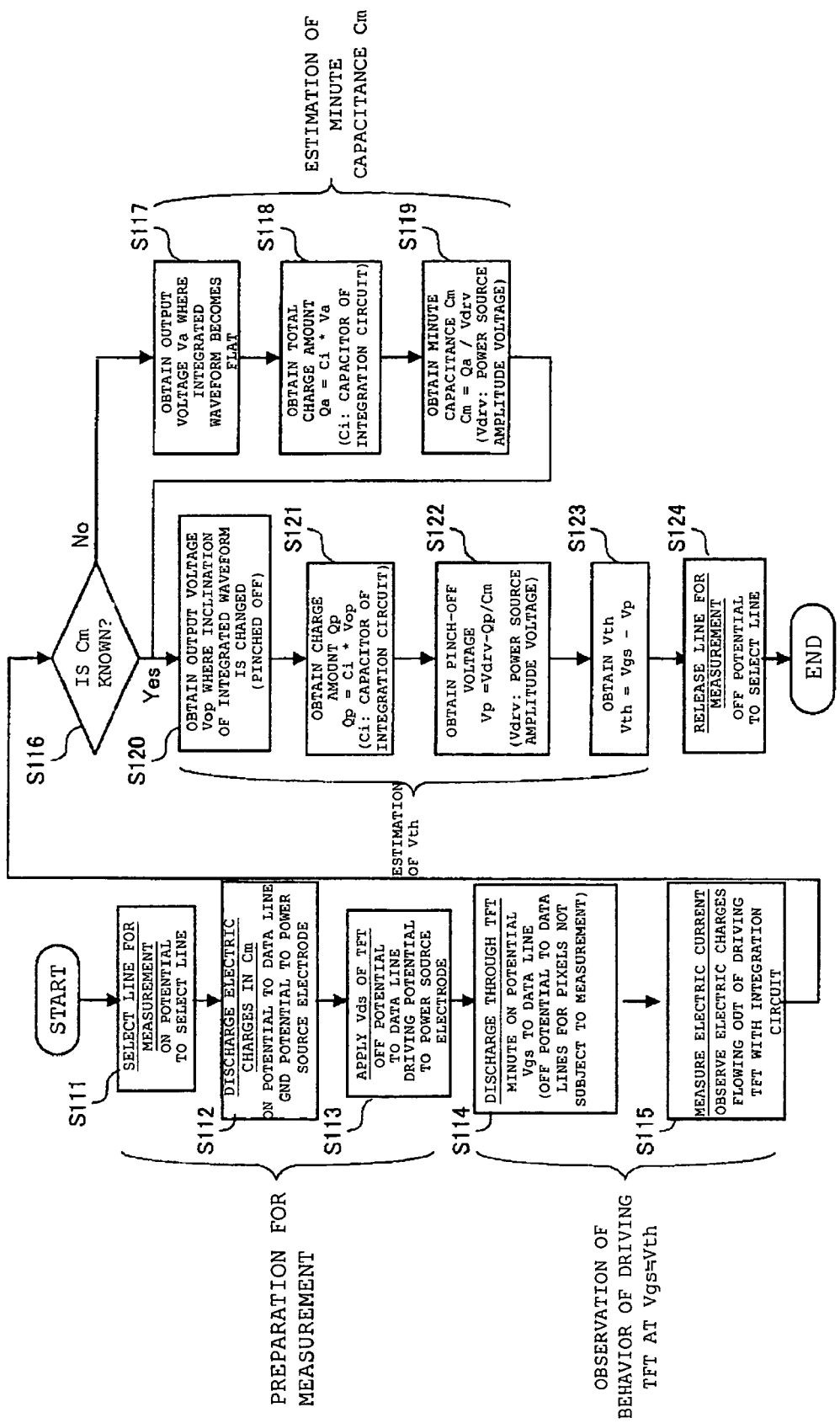
FIG. 7 is a flowchart describing processing for estimating a threshold voltage Vth in detail.

FIG. 7 is a flowchart for describing the processing for estimating the threshold voltage Vth in detail, which is shown in Step S102 of FIG. 6. Here, a flow of measurement of Vth of the voltage programming pixel circuit without the Vth compensating function is illustrated. In the processing for estimating Vth, Steps S111 to S113 are firstly executed as preparation for measurement. Thereafter, a current is observed when a known minute voltage Vgs is applied to a driving TFT. That is, in Steps S114 and S115, behavior of the driving TFT when Vgs≈Vth is observed. Here, Vgs is a voltage between a gate and a source of the driving TFT. Thereafter, when minute capacitance Cm is unknown, estimation of the minute capacitance Cm is executed in Steps S117 to S119. Meanwhile, if the minute capacitance is known or after estimating the minute capacitance Cm, estimation of Vth using a measured value (an estimated value) of the minute capacitance Cm is executed in Steps S120 to S123.

In the processing for estimating the threshold voltage Vth shown in FIG. 7, a line for measurement is selected by applying ON potential to a select line (Select) to begin with (Step S111). In the example shown in FIG. 4B, the switch SW1 is brought into conduction. Next, a voltage sufficient for turning on the driving TFT Tr. d is applied to the data line (Data) and a power source to be connected to the minute capacitance Cm is set to GND potential (Step S112). In this way, in FIG. 4B, Tr. d is brought into conduction and electric potential at both ends of Cm are set to GND, whereby electric charges of Cm is discharged to be 0. Thereafter, a voltage sufficient for turning off the driving TFT is applied to the data line (Data) and the power source connected to the minute capacitance Cm is set to driving potential (Step S113). In this way, it is possible to apply a voltage to Vds while remaining the driving TFT turned off. In FIG. 4B, a voltage Vd is applied between the drain and the source of Tr. d. The preparation for measurement is completed by the flow described above.

Next, minute ON potential Vgs sufficient for tuning on the driving TFT is applied to the data line (Data). Meanwhile, OFF potential is applied to the data lines (Data) for the pixels not subject to measurement (Step S114). Accordingly, the driving TFT initiates conduction and potential of an electrode of the minute capacitance Cm on the driving TFT side changes toward the GND potential. In this event, the driving TFT flows a constant current which is determined by Vgs. In FIG. 4B, the driving TFT Tr. d conducts the constant current through Cm. Then, by connecting an integration circuit to the wiring to which the source of the driving TFT is connected, it is possible to observe the electric current flowing on the driving TFT by use of the integration circuit (Step S115). The observation of the behavior of the driving TFT when Vgs≈Vth is completed by the flow described above.

Figure 8:
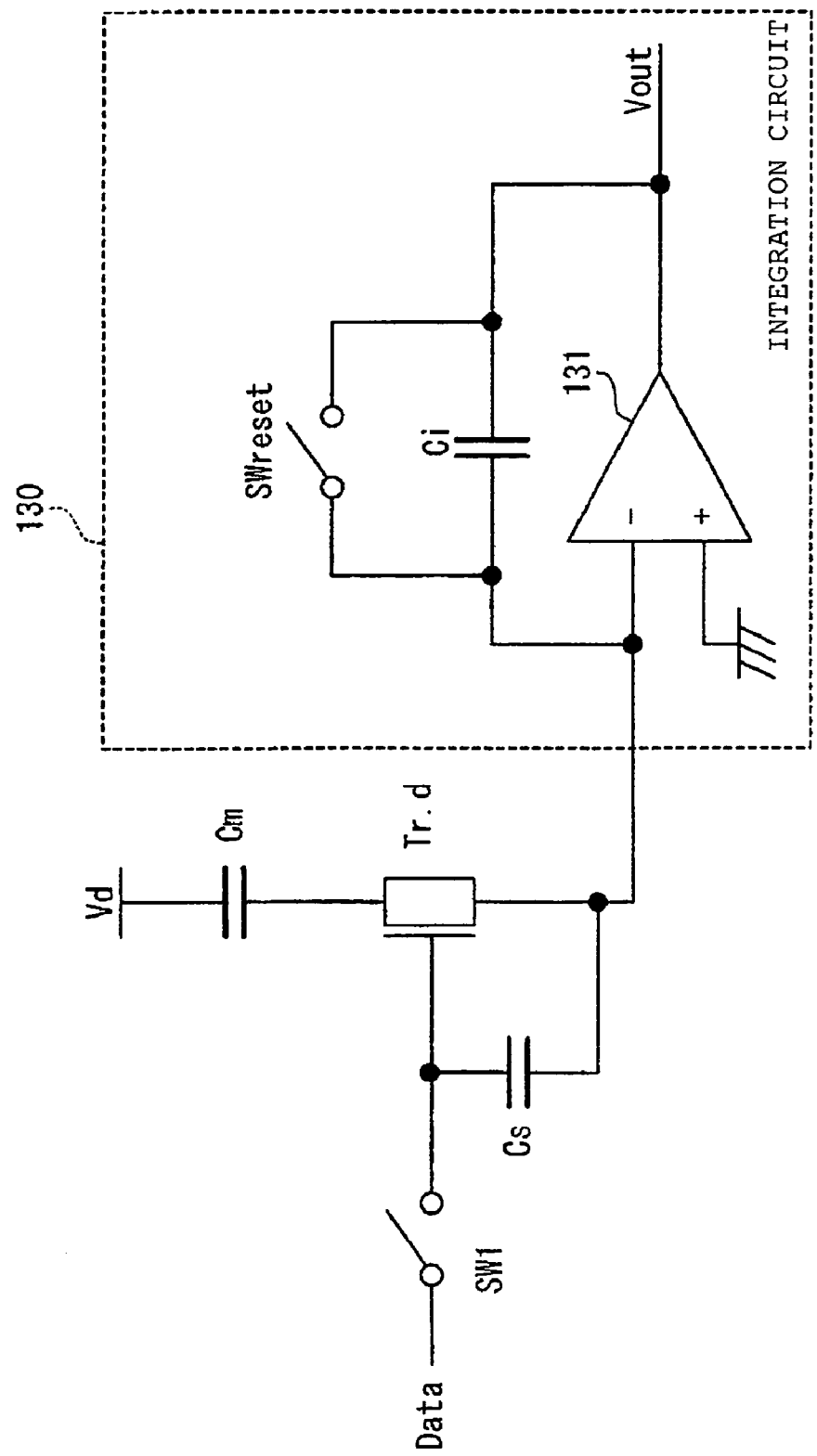
FIG. 8 is a diagram showing an example of an integration circuit used for observation of an electric current flowing on a driving TFT.

FIG. 8 is a view showing an example of an integration circuit used for observation of the electric current flowing on the driving TFT. FIG. 8 shows the case where an integration circuit 130 is connected to the circuit shown in FIG. 4B. Such an integration circuit 130 is provided to each of the signal generation and signal measurement circuits 14 and 16 shown in FIG. 2. The integration circuit 130 shown in FIG. 8 includes an operational amplifier 131, a capacitor Ci, and a reset switch SWreset. Here, the source side of the driving TFT Tr. d is set to GND potential due to an imaginary short circuit caused by the integration circuit 130. Note that operations of the integration circuit 130 are also described in detail in U.S. Pat. No. 5,179,345. The integration circuit 130 can be connected similarly to other pixel circuits. An output from the integration circuit 130 is converted into digital data by an A/D converter circuit to be provided to the measurement control circuits 13 shown in FIG. 2 and taken into the computer 12. In this way, subsequent estimation processing becomes possible.

Back to FIG. 7, the subsequent processing branches off depending on whether the value of the minute capacitance Cm is known or unknown (Step 116). For example, when it is possible to accurately control the distance between the TFT array 100 and the counter electrode 18 to be approximated to this TFT array 100 and when the flatness of the electrode is sufficiently high, it is conceivable to repeatedly use either a calculated Cm value or a result of Cm measurement performed once. Such an aspect is deemed as the case where Cm is known. When the minute capacitance Cm is known as described above, the processing for estimating Vth is carried out in accordance with Step 120 and the sebsequent steps. When the minute capacitance Cm is unknown, the processing for estimating Cm is carried out in accordance with Steps 117 to 119. Here, an output voltage Va where an integrated waveform taken into the computer 12 becomes flat is obtained (Step S117), and a total charge amount Qa that passed through the driving TFT is calculated from the capacitor Ci of the integration circuit. To be more precise, the total charge amount Qa is calculated by use of the following equation:

$$Qa=Ci*Va$$

The total charge amount Qa thus calculated is divided by a voltage applied to the minute capacitance Cm (which is equal to Vd in FIG. 4B), and the value of the minute capacitance Cm is thereby estimated (Step S119). Specifically, when an amplitude voltage of the power source is Vdrv, the value of the minute capacitance Cm can be estimated by use of the following equation:

$$Cm=Qa/Vdrv$$

Figure 9:
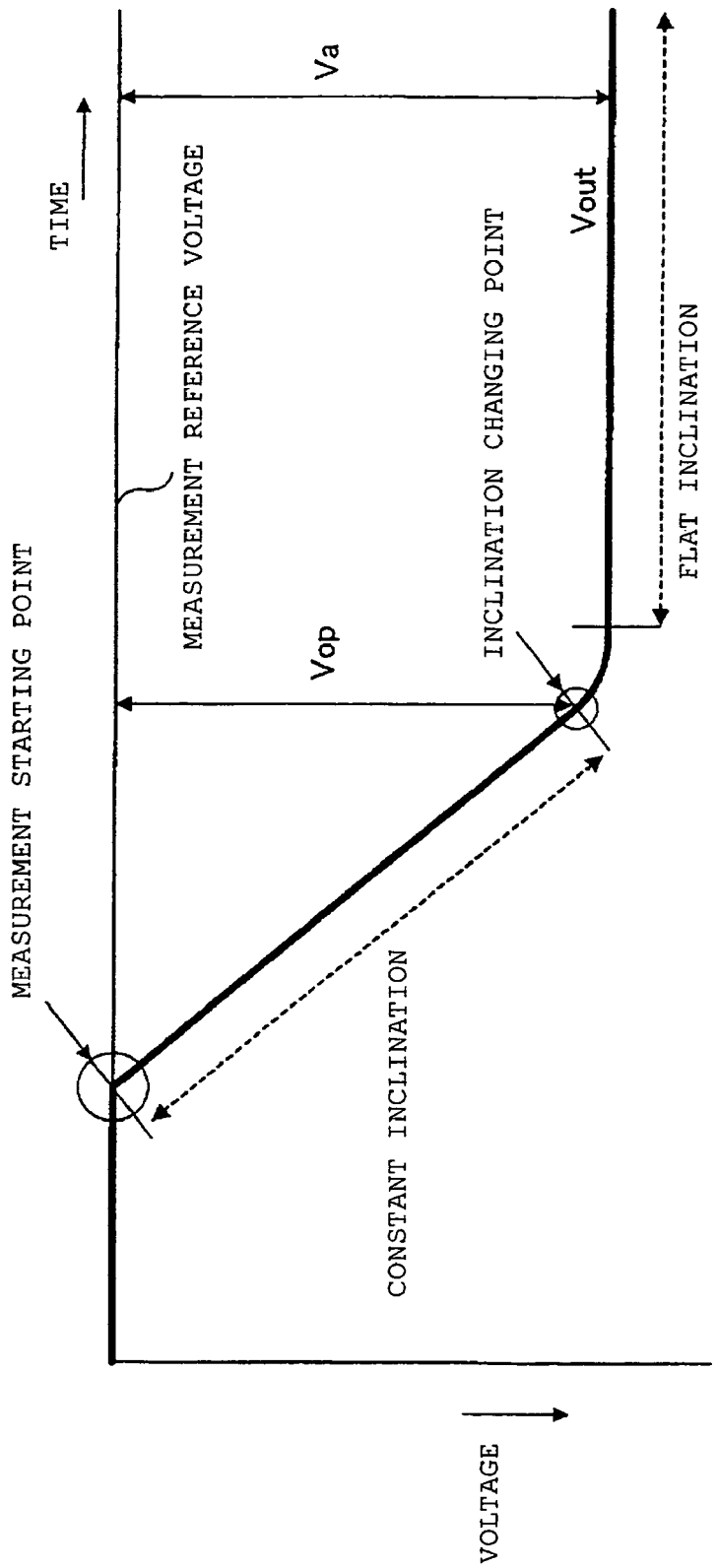
FIG. 9 is a view showing an example of an output from the integration circuit.

FIG. 9 is a graph showing an example of an output from the integration circuit 130 of FIG. 8. The lateral axis indicates the time and the longitudinal axis indicates the voltage. After starting the measurement, a voltage having a constant inclination is generated during a period when the driving TFT conducts a constant electric current (a saturated region). Thereafter, the inclination begins to change at an inclination changing point, and the inclination of the output waveform becomes flat when the electric current value is 0, that is, when the driving TFT stops conducting the electric current. The inclination changing point is deemed as a point where an operating point of the driving TFT shifts from the saturated region to a linear region. An output voltage Vop where the inclination of the integrated waveform changes (pinches off) and the output voltage Va where the integrated waveform becomes flat are obtained, and these values are used to estimate the minute capacitance Cm and the threshold voltage Vth as described above. Here, an integration circuit output curve as shown in FIG. 9 is differentiated by the computer 12 to obtain a voltage changing amount per unit time, and the inclination changing point is thereby determined. The integration circuit output voltage at this point is Vop. It should be noted, however, that FIG. 9 is only for explaining the principle and showing the case where an offset voltage is 0 V. The offset voltage is a voltage attributable to electric charges which go in and out of GND wiring to and from control signal wiring through parasitic capacitance when driving a control signal, such as Vout to be described later (see FIG. 15). In an actual inspection device, calculation is performed while taking the offset voltage into account as described in the example shown in FIG. 14 and the latter drawings. Here, this offset voltage is ignored for facilitating the explanation of the principle.

Back to FIG. 7, the processing for estimating Vth is carried out thereafter. To be more precise, the point where the inclination of the integrated waveform changes (the inclination changing point) is obtained as described in FIG. 9, and the output voltage Vop of the integration circuit 130 at this point is obtained (Step S120). A charge amount Qp that the driving TFT flew until reaching a pinch-off state is obtained by use of the obtained output voltage Vop and the capacitor Ci of the integration circuit 130 (Step S121), that is to calculate by the equation:

$$Qp=Ci*Vop$$

A difference between a voltage obtained by dividing this value by Cm and the voltage applied to the minute capacitance Cm (which is equal to Vd in FIG. 4B) represents the pinch-off voltage Vp of the driving TFT. That is, when using the amplitude voltage Vdrv of the power source, the pinch-off voltage Vp can be obtained as follows (Step S122):

$$Vp=Vdrv-Qp/Cm$$

Here, if a difference between the minute ON voltage Vgs applied to the data line (Data) which is sufficient for turning on the driving TFT and the pinch-off voltage Vp is obtained, then it is possible to obtain Vth of the driving TFT (Step S123), namely:

$$Vth=Vgs-Vp$$

The threshold voltage Vth can be estimated by the flow described above. Thereafter, Off potential is supplied to the select line (Select) and the line for measurement is released (Steps S124). In this way, the series of processing for Vth estimation is completed.

Next, description will be made on the processing for estimating the pinch-off voltage Vp in the case of the pixel circuit having the Vth compensating function, which corresponds to Step S103 shown in FIG. 6.

Figure 10:
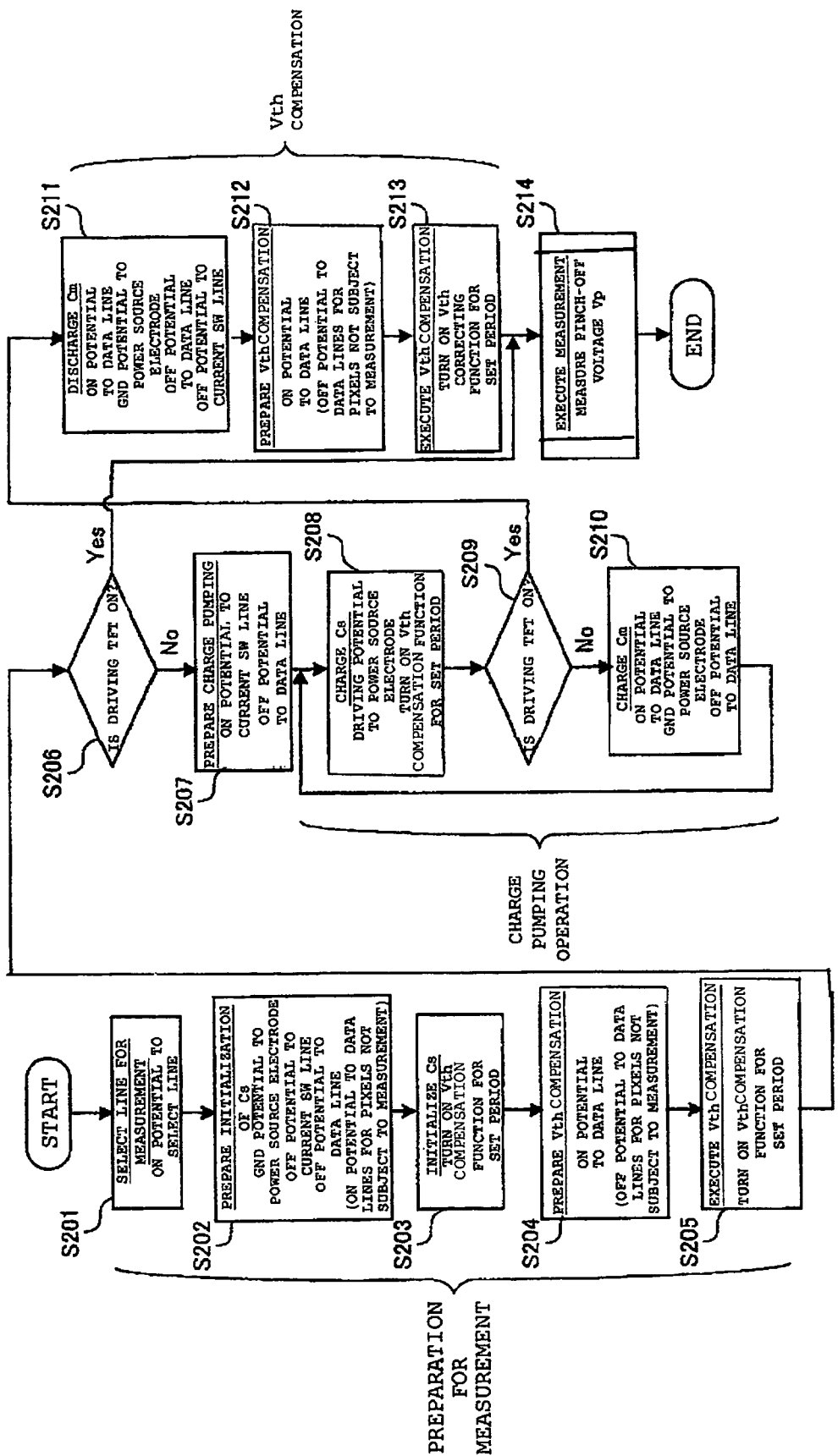
FIG. 10 is a flowchart showing a flow of Vth setting by use of charge pumping for increasing and decreasing a voltage through a capacitor, which is performed in the first half of processing for estimating a pinch-off voltage Vp.

FIG. 10 is a flowchart showing a flow of Vth setting by use of charge pumping for increasing and decreasing a voltage through a capacitor, which is performed in the first half of the processing for estimating the pinch-off voltage Vp. To be more precise, this processing is executed by the voltage programming pixel circuit with the Vth compensating function as shown in FIG. 5B. Here, Steps S201 to S205 are firstly executed as preparation for measurement. Thereafter, a charge pumping operation is executed in Steps S208 to S210, and the processing for Vth compensation is executed in Steps S211 to S213. Thereafter, measurement of the pinch-off voltage Vp is carried out in Step S214.

The flowchart shown in FIG. 10 will be described with reference to FIG. 5B. First, for preparation of the measurement, a line for measurement is selected by applying ON potential to a select line (Select) and thereby bringing the switch SW1 into conduction (Step S201). Meanwhile, the power source to be connected to the minute capacitance Cm is set to GND potential and OFF potential is applied to the current SW control line (Current cnt.) and the data line (Data) (and ON potential is applied to the data lines (Data) of pixels not subject to measurement), and preparation for initializing the pixel capacitor Cs is thereby performed (Step S202). In this state, ON potential is applied to the Vth compensation control line (Vth cnt.) for a set period (only for a certain period), and the pixel capacitor Cs is thereby initialized (Step S203). In the meantime, ON potential is applied to the data line (Data) (and OFF potential is applied to the data lines (Data) of pixels not subject to measurement), and preparation for Vth compensation is thereby performed (Step S204). Thereafter, ON potential is applied to the Vth compensation control line (Vth cnt.) for a set period (only for a certain period), and the Vth compensation is thereby executed (Step S205). The reason for applying the ON potential to the data line (Data) is to raise a gate voltage of the driving TFT (Tr. d) as high as possible. Here, judgment is made as to whether the driving TFT is set to an ON state by confirming an electric current in the output of the integration circuit 130 as shown in FIG. 8 (Step S206). When the driving TFT is in the ON state, the process moves to Step S214 based on the judgment that the Vth compensation is completed. When the driving TFT is not in the ON state, the process moves to Step S207 and the charge pumping operation is executed. As described above, in the preparation for measurement, when the ON potential is applied to the data line (Data) for the pixel not subject to measurement in Step S202 and the Vth compensation is performed in Step S203, a voltage held in the pixel capacitor Cs of the pixel not subject to measurement reaches Vth at the maximum. Then, by applying the OFF potential to the data line (Data) of the pixel not subject to measurement in Step S204, the voltage held in the pixel capacitor Cs of the pixel not subject to measurement is reduced to a value which is lower than Vth by a potential difference between the ON potential and the OFF potential. In this way, it is possible to completely turn OFF the pixel not subject to measurement.

Upon the charge pumping operation, preparation of the charge pumping operation is firstly performed by applying the ON potential to the current SW control line (Current cnt.) and applying the OFF potential to the data line (Data) (Step S207). Then, in the charge pumping operation, the power source to be connected to the minute capacitance Cm is firstly set to the driving potential and the ON potential is applied to the Vth compensation control line (Vth cnt.) for a set period (only for a certain period), and the pixel capacitor Cs2 is thereby charged and the gate voltage of the driving TFT (Tr. d) is increased (Step S208). Here, judgment is made as to whether the driving TFT is set to the ON state by confirming the electric current in the output of the integration circuit 130 as shown in FIG. 8 (Step S209). When the driving TFT is set to the ON state, generation in Cs2 of the voltage higher than Vth can be confirmed, and the process moves to the Vth compensation processing in Step S211 and the latter. When the driving TFT is not set to the ON state in Step S209, the ON potential is applied to the data line (Data) so as to bring the driving TFT closer to the ON state. Here, the power source connected to the minute capacitance Cm is reduced to the GND potential and the electric charges in the minute capacitance Cm are discharged to GND. Then the OFF potential is applied to the data line (Data) (Step S210), and the process returns to Step S208. The processing from Step S208 to Step S210 is repeated until the driving TFT is set to the ON state.

Figure 11:
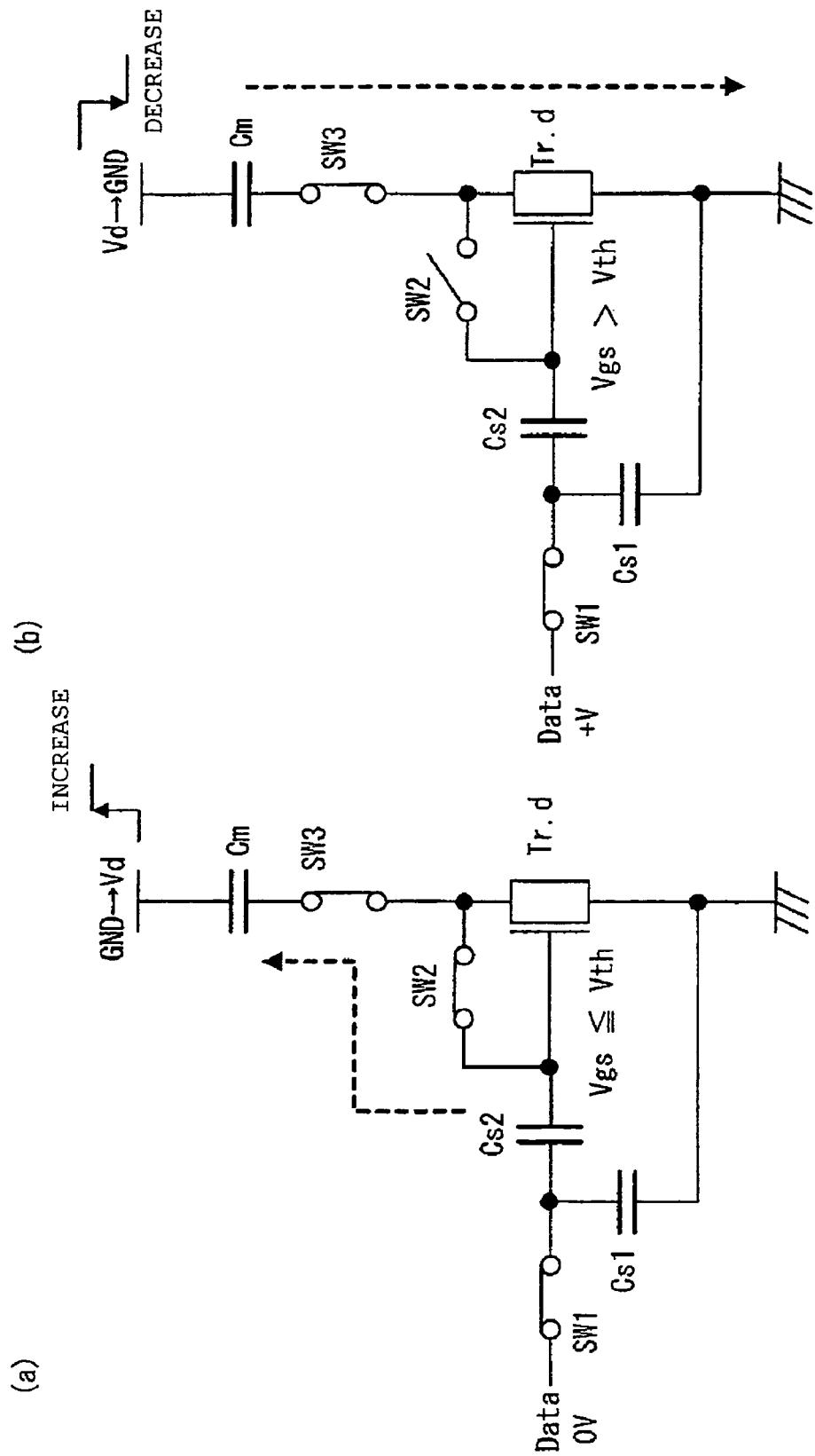
FIGS. 11A and 11B are views for explaining a charge pumping operation.

FIGS. 11A and 11B are diagrams for explaining the charge pumping operation in Steps S207 to S210. According to the procedures in Step S207 and Step S208, as shown in FIG. 11A, electric potential of an electrode of the pixel capacitor Cs2 connected to the gate of the driving TFT (Tr. d) is increased. That is, the ON potential is provided to the current SW control line (Current cnt.) to turn ON the switch SW3 and the data line (Data) is set to 0 V. At this stage, the power source connected to the minute capacitance Cm is set to the driving potential Vd, and the ON potential is applied to the Vth compensation control line (Vth cnt.) for a set period to turn the switch SW2 ON. Accordingly, the pixel capacitor Cs2 is charged and the gate voltage of the driving TFT (Tr. d) is thereby increased.

Meanwhile, when the driving TFT (Tr. d) is not in the ON state as shown in FIG. 11B, the ON potential (+V) is applied to the data line (Data). Then, the OFF potential is applied to the Vth compensation control line (Vth cnt.) to set the switch SW2 to the OFF state, and then the power source connected to the minute capacitance Cm is reduced to the GND potential. Although there may be the case that the driving TFT (Tr. d) is not turned ON even when the ON potential (+V) is applied to the data line (Data), the driving TFT (Tr. d) has a channel width which is sufficiently larger as compared to that of the switch SW2. Accordingly, the processing in Step S210 becomes possible because of a leak current thereof.

After the charge pumping operation as described above, in the Vth compensation processing, the minute capacitance Cm is discharged by setting the power source connected to the minute capacitance Cm to the GND potential while continuing application of the ON potential to the data line (Data) (Step S211). The reason for applying the ON potential to the data line (Data) is to securely set the driving TFT (Tr. d) to the ON state. Then, the OFF potential is applied to the data line (Data) and to the current SW control line (Current cnt.). Thereafter, the ON potential is applied to the data line (Data) (and the OFF potential is applied to the data lines (Data) for the pixels not subject to measurement) for preparation of the Vth compensation (Step S212). The Vth compensation is completed by applying the ON potential to the Vth compensation control line (Vth cnt.) for a certain period and thereby turning the Vth compensating function ON for the set period (Step S213). Thereafter, the process moves to Step S214 to measure the pinch-off voltage Vp.

Figure 12:
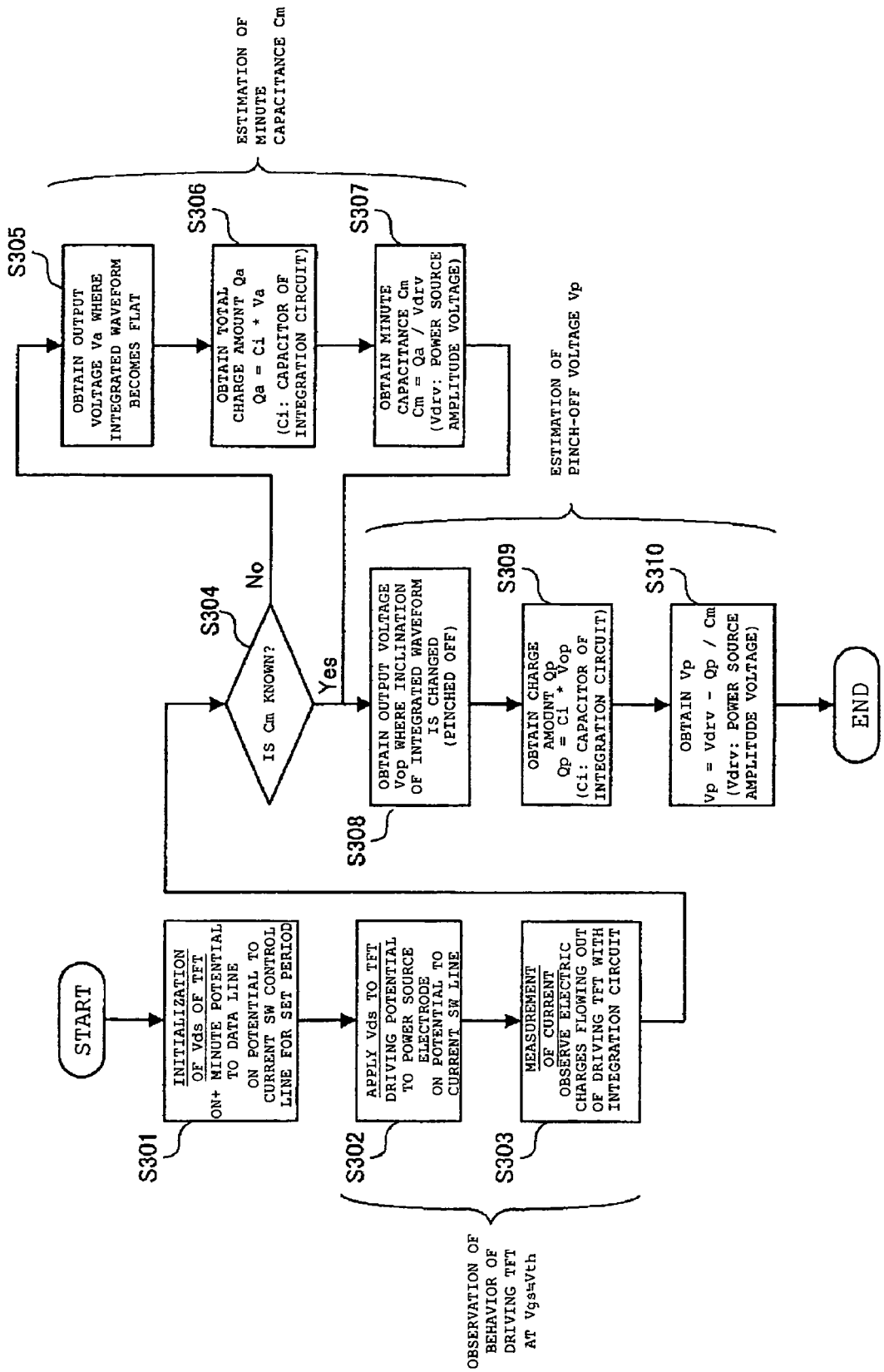
FIG. 12 is a flowchart showing processing for measuring (estimating) the pinch-off voltage Vp.

FIG. 12 is a flowchart showing the processing for measuring (estimating) the pinch-off voltage Vp in Step S214. In the processing for measuring (estimating) the pinch-off voltage Vp, behavior of the driving TFT when Vgs≈Vth is observed in Steps S302 and S303. Thereafter, when the minute capacitance Cm is unknown, estimation of the minute capacitance Cm is carried out in Steps S305 to S307. Meanwhile, when the minute capacitance is known or after estimating the minute capacitance Cm, estimation of the pinch-off voltage Vp is executed in Steps S308 to S310.

In the processing shown in FIG. 12, ON+ minute potential is firstly applied to the data line (Data) and the ON potential is applied to the current SW control line (Current cnt.) for a certain period (Step S301), whereby electric charges in the minute capacitance Cm are discharged. Then, the driving potential is provided to a power source electrode to be connected to the minute capacitance Cm and the ON potential is applied to the current SW control line (Current cnt.), whereby the voltage Vds is applied to the drain of the driving TFT (Step S302). Here, the electric charges flowing out of the driving TFT are observed with the integration circuit 130 which has been described by use of FIG. 8 and FIG. 9 (Step S303). An output from the integration circuit 130 is converted into digital data by use of the A/D converter circuit in the measurement control circuits 13 shown in FIG. 2 and is taken into the computer 12, whereby subsequent estimation becomes possible.

Here, the subsequent processing branches off depending on whether the value of the minute capacitance Cm is known or unknown (Step 304). When the minute capacitance Cm is unknown, the process moves to the processing for estimating the minute capacitance Cm in Steps S305 to S307. When the value of the minute capacitance Cm is known, the process moves directly to the processing for estimating the pinch-off voltage Vp in Steps S308 to S310. With reference to FIG. 9, in the processing for estimating the minute capacitance Cm, the output voltage Va where the integrated waveform taken into the computer 12 becomes flat is obtained to begin with (Step S305). The total charge amount Qa that passed through the driving TFT is calculated from the obtained output voltage Va and the capacitor Ci of the integration circuit as follows (Step S306):

$$Qa=Ci*Va$$

Then, the value of the minute capacitance Cm can be estimated by dividing the total charge amount Qa by the power-source amplitude voltage Vdrv (which is equal to Vd in FIGS. 5A and 5B) applied to the minute capacitance Cm (Step S307), namely by the equation:

$$Cm=Qa/Vdrv$$

Next, in the estimation of the pinch-off voltage Vp, the output voltage Vop where the inclination of the integrated waveform as shown in FIG. 9 is changed (pinched off) is firstly obtained (Step S308). Then, the charge amount Qp that the driving TFT flew until reaching a pinch-off state is obtained by use of the output voltage Vop of the integration circuit 130 at this point and the value of the capacitor Ci of the integration circuit 130 (Step S309). This charge amount is calculated by:

$$Qp=Ci*Vop$$

A difference between a voltage obtained by dividing by Cm the value of charge amount Qp thus obtained and the power-source amplitude voltage Vdrv (which is equal to Vd in FIGS. 5A and 5B) represents the pinch-off voltage Vp of the driving TFT. That is, the pinch-off voltage Vp is obtained by the following equation (Step S310):

$$Vp=Vdrv-Qp/Cm$$

Here, if a Vth compensation circuit operates normally, Vgs after the Vth compensation is supposed to be equal to Vth, namely:

$$Vgs=Vth$$

Therefore, in an ideal state, the obtained pinch-off voltage Vp is expressed by:

$$Vp=Vgs-Vth=0$$

By estimating the pinch-off voltage Vp after the Vth compensation as described above, it is possible to judge the quality of the Vth compensating function. When the Vth compensation is carried out normally, the pinch-off voltage Vp shows a sufficiently small voltage as described above.

After the Vth estimation in Step S102 and estimation of the pinch-off voltage Vp in Step S103 shown in FIG. 6 are performed as described above, a result of inspection is evaluated in Step S104.

Figure 13:
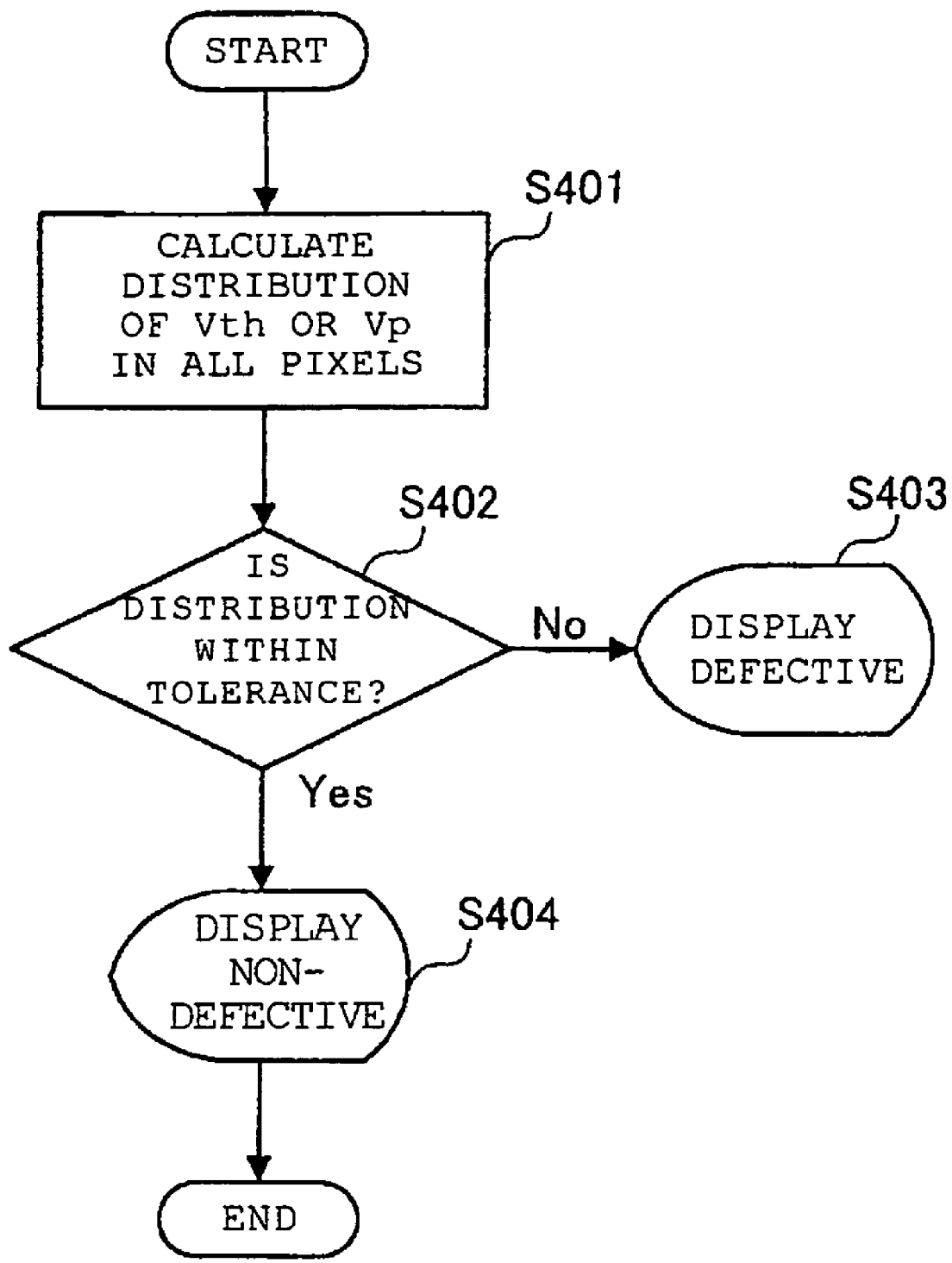
FIG. 13 is a flowchart showing a flow of evaluating the result of inspection.

FIG. 13 is a flowchart showing a flow of evaluation of the result of inspection. The computer 12 shown in FIG. 2 calculates distribution of the estimated Vth or the pinch-off voltage Vp in the entire panel (Step S401). Then, judgment is made as to whether the calculated distribution falls into the value stored in the storage device 11, that is, within a preset tolerance (Step S402). When the distribution is not within the tolerance, a "defective" sign is indicated on a display of the computer 12 (Step S403). When the distribution falls in the tolerance, a "non-defective" sign is indicated on the display of the computer 12 (Step S404) and the processing is completed.

Next, this embodiment will be described in more detail by use of concrete examples on a two-TFT voltage programming pixel circuit and on a four-TFT voltage programming pixel circuit, respectively.

Figure 14:
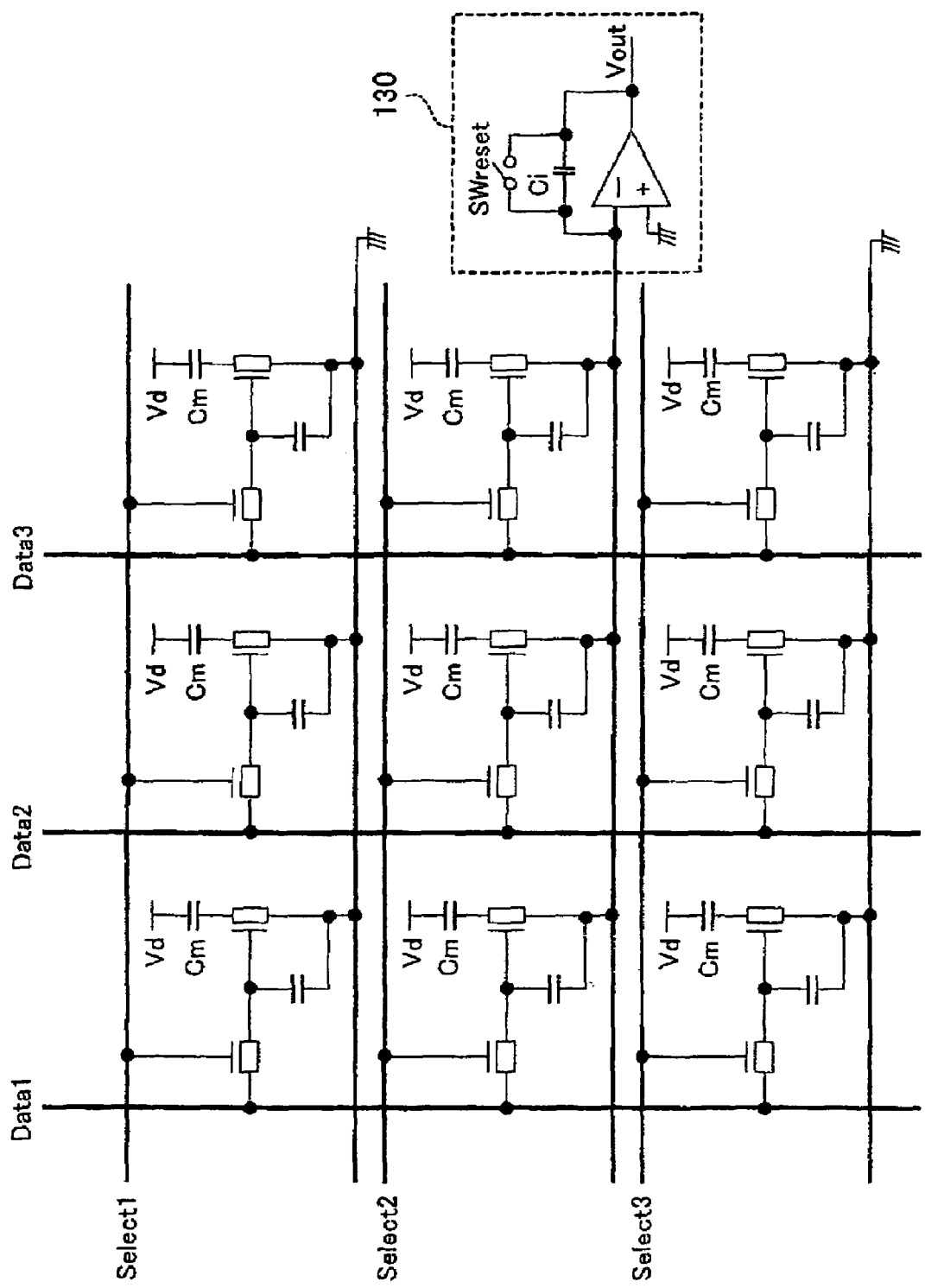
FIG. 14 is a view showing an example of application to a voltage programming panel in which each pixel circuit includes two TFTs.
Figure 15:
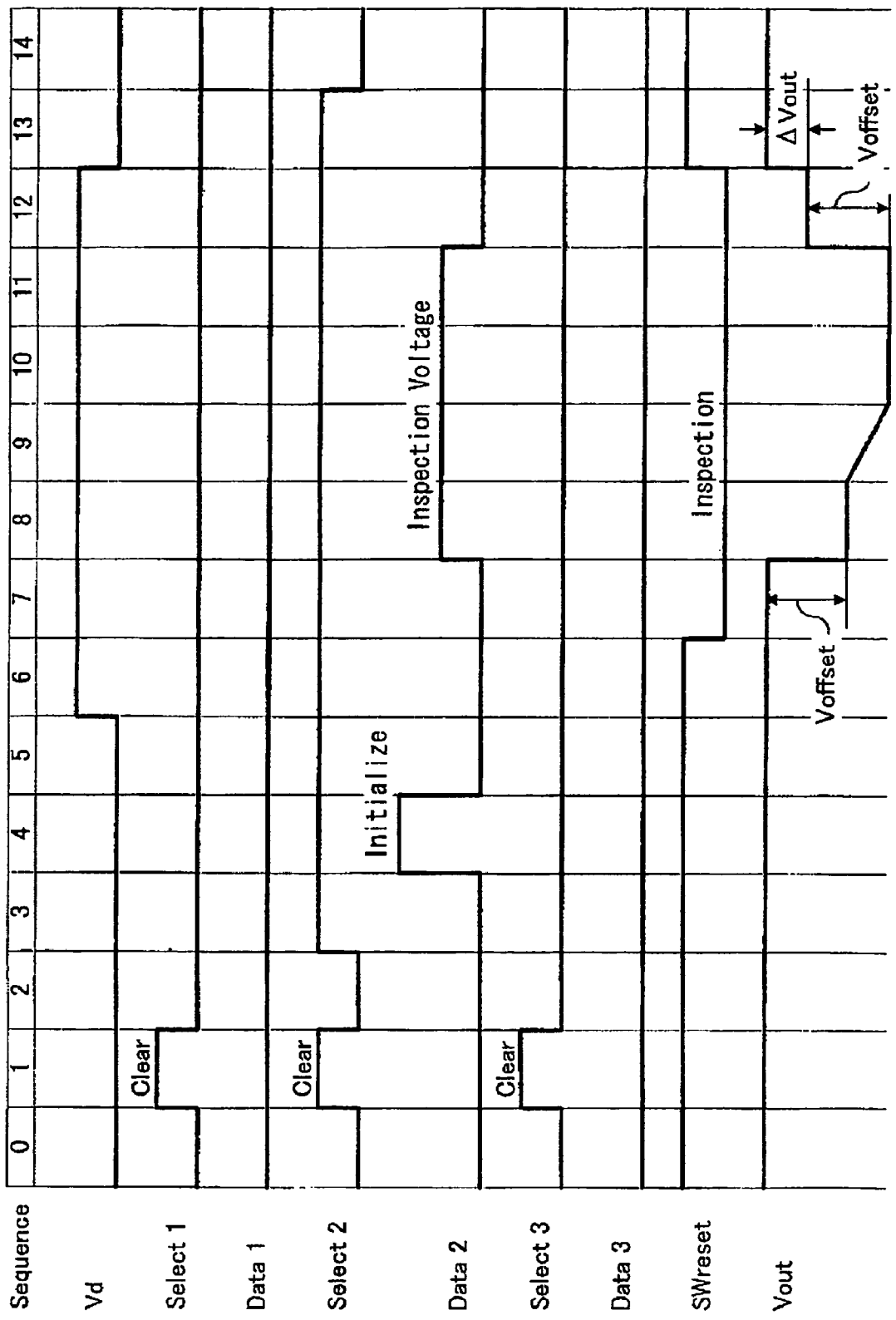
FIG. 15 is a view showing driving waveforms for measurement in the two-TFT voltage programming pixel circuit.

FIG. 14 is a view showing an application example of the embodiment to a voltage programming panel in which each pixel circuit includes two TFTs. FIG. 15 shows driving waveforms for measurement in this two-TFT voltage programming pixel circuit. The application example shown in FIG. 14 illustrates 3×3 pixels as part of the panel. In FIG. 14, a pixel subject to measurement is the pixel in the center, and the integration circuit 130 is connected to GND wiring for the pixel subject to measurement. In the driving waveforms shown in FIG. 15, when minute potential (Inspection voltage) is applied to a driving TFT of the pixel in the center (Select 2, Data 2) of FIG. 14 which is the pixel subject to measurement, it is possible to observe an aspect of an electric current appearing on an integration circuit output Vout. Actual measurement is performed by repeating the above-described measurement method for all the pixels. Here, in the integration circuit 130 shown in FIG. 14, although GND lines seem to be connected to an inverting input of the integration circuit 130 independently, there is also a case in practice that some GND lines (or all the GND lines) are bundled to be a common line. If the integration circuits 130 are provided in the number of groups of the bundled GND lines, it is possible to perform measurement for the respective groups in parallel. Note that the GND lines will be substituted by power lines when p-channel driving TFTs are applied thereto.

Here, description will be made based on sequences which are indicated on the uppermost row of FIG. 15.

Sequence 1: An OFF voltage is written in all the pixels to put out the light of the panel.

Sequence 3: A line where the pixel subject to measurement exists thereon is selected by tuning Select 2 ON.

Sequence 4: ON potential is applied to Data 2 (Initialize), and electric charges in Cm of the pixel subject to measurement are discharged.

Sequence 6: Driving potential is applied to Vd and a voltage is applied to the drain of the driving TFT.

Sequence 7: The integration circuit 130 is activated for starting the measurement.

Sequence 8: The inspection voltage which is minute potential exceeding Vth is applied to Data 2 to set the driving TFT to a minutely ON state. In this event, an offset voltage occurs in the integrated circuit output Vout due to a voltage change in Data 2.

Sequence 9: A constant current is observed in the integrated circuit output Vout. Since the driving TFT is conducting the constant current in a saturated region, the integrated circuit output Vout is changed by a constant inclination.

Sequence 12: OFF potential is applied to Data 2. In this event, the offset voltage occurring in the integration circuit output Vout is canceled due to the voltage change in Data 2.

Sequence 13: Measurement is completed.

The above-described sequences are managed by the computer 12 shown in FIG. 2, and the respective operations are controlled by the measurement control circuits 13 based on commands outputted from the computer 12 to the measurement control circuits 13. The output waveform of the integration circuit 130 (the waveform of the integration circuit output Vout) obtained by the above-described sequences is subjected to A/D conversion by the measurement control circuits 13, and the following calculations are executed by the computer 12.

[Measurement of the Capacitance Cm]

A potential difference of Vout ($\Box\Box$ Vout) between Sequences 12 and 13 represents the charge amount Qa which flew from Cm. The offset voltage (Voffset) occurs in Vout at the timing of applying and removing the inspection voltage to and from the line Data 2 (Sequences 8 and 12). This is because electric charges go in and out of the GND wiring through parasitic capacitance when the electric potential of the line Data 2 is changed. In other words, the potential difference of Vout ($\Box\Box$ Vout) between Sequences 12 and 13 represents a voltage attributable to the charge amount Qa which flew out of Cm of the pixel subject to measurement, that is:

$$Qa = \Box\Box Vout * Ci$$

Here, Ci is the capacitor of the integration circuit. Meanwhile, after discharge in Sequence 4, Cm is charged by the voltage Vd in Sequences 8 and 9. Therefore, it is possible to estimate the capacitance Cm by calculating the following equation:

$$Cm = Qa/Vd$$

[Estimation of Vth]

The inclination changing point as shown in FIG. 9 is obtained from the output of the integration circuit 130, and electric potential set back from Vout by $\Box\Box$Vout in Sequence 11 is defined as a measurement reference voltage. When a potential difference ($\Box\Box$ Voutp) between this measurement reference voltage and the voltage at the inclination changing point is obtained (this is an operation for eliminating the electric charges which generate Voffset and thereby considering only the electric charges from Cm), Vth can be estimated by:

$$Vth = Vgs - (Vd - \Box\Box Voutp * Ci/Cm)$$

Unevenness in Vth in the panel can be evaluated by obtaining this value for every pixel.

[Estimation of a Vgs-Id Characteristic]

Unevenness in the driving currents at a certain Vgs value can be evaluated by obtaining the inclination of Vout in Sequence 9. When a plurality of the minute potential values for application are selected in Sequence 8, a plurality of Id corresponding to Vgs are obtained. By comparing the plurality of Id in terms of all the pixels, it is possible to evaluate unevenness in characteristics among the driving TFTs.

Next, the example in the four-TFT voltage programming pixel circuit will be described.

Figure 16:
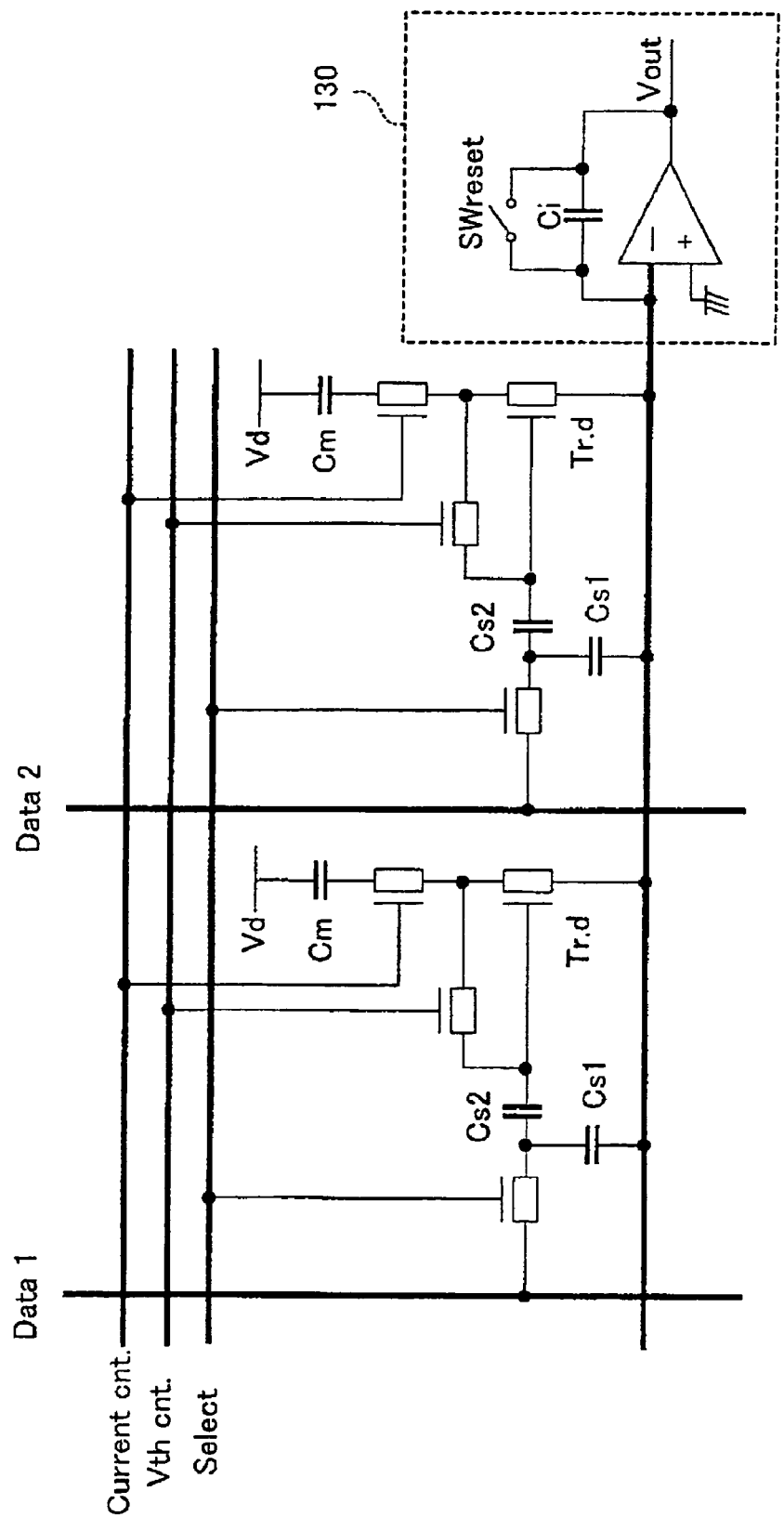
FIG. 16 is a view showing an example of realizing a voltage programming panel in which each pixel circuit includes four TFTs.

FIG. 16 is a view showing the example of a voltage programming panel in which each pixel circuit includes four TFTs. FIG. 16 illustrates part of the panel (two pixels) and a pixel subject to measurement is the pixel on the left side. Actual measurement is performed by repeating the above-described measurement method for all the pixels.

Figure 17:
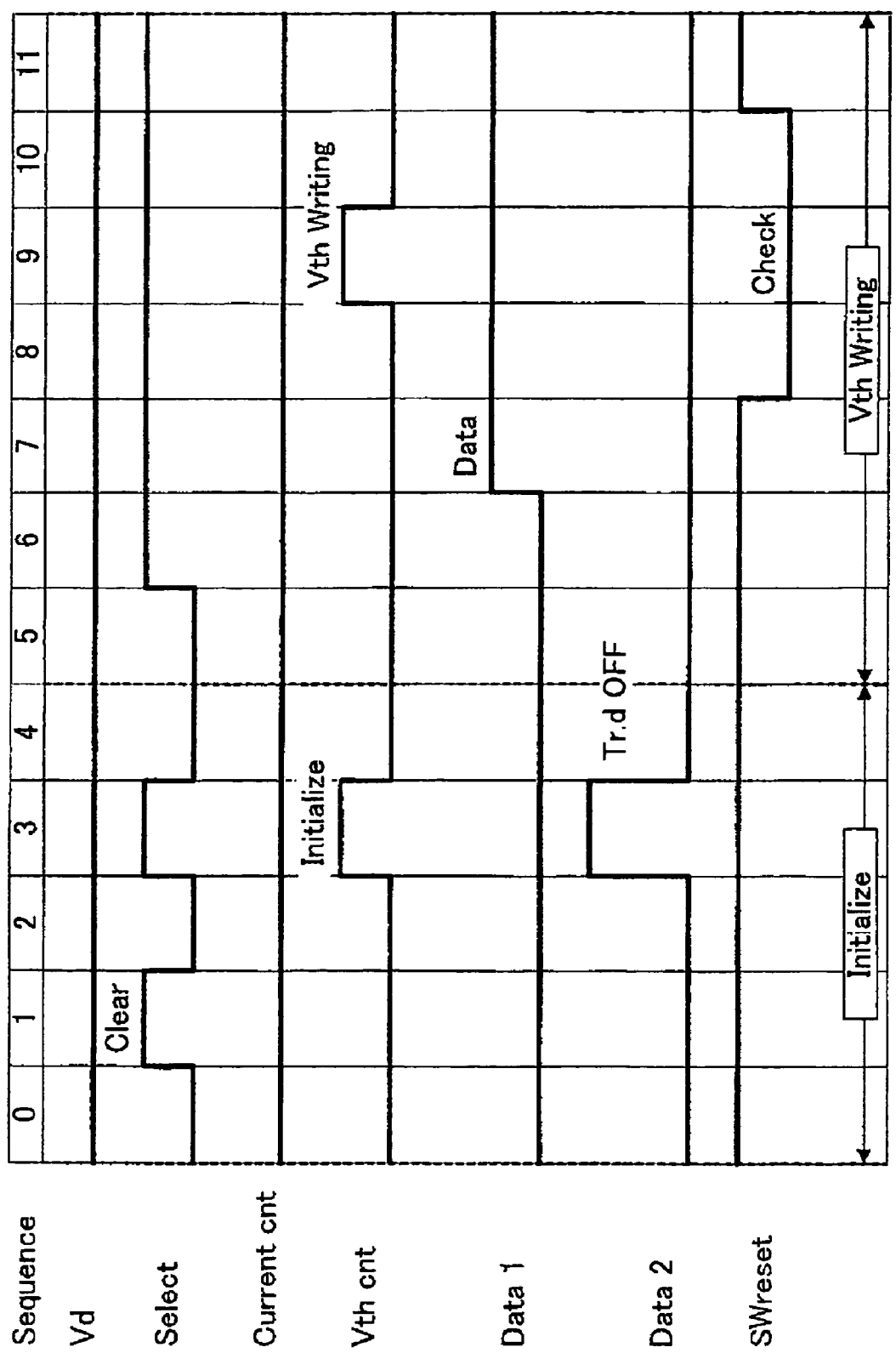
FIG. 17 is a view showing driving waveforms in an initializing operation (Sequences 1 to 4) and a Vth writing operation (Sequences 5 to 11).
Figure 18:
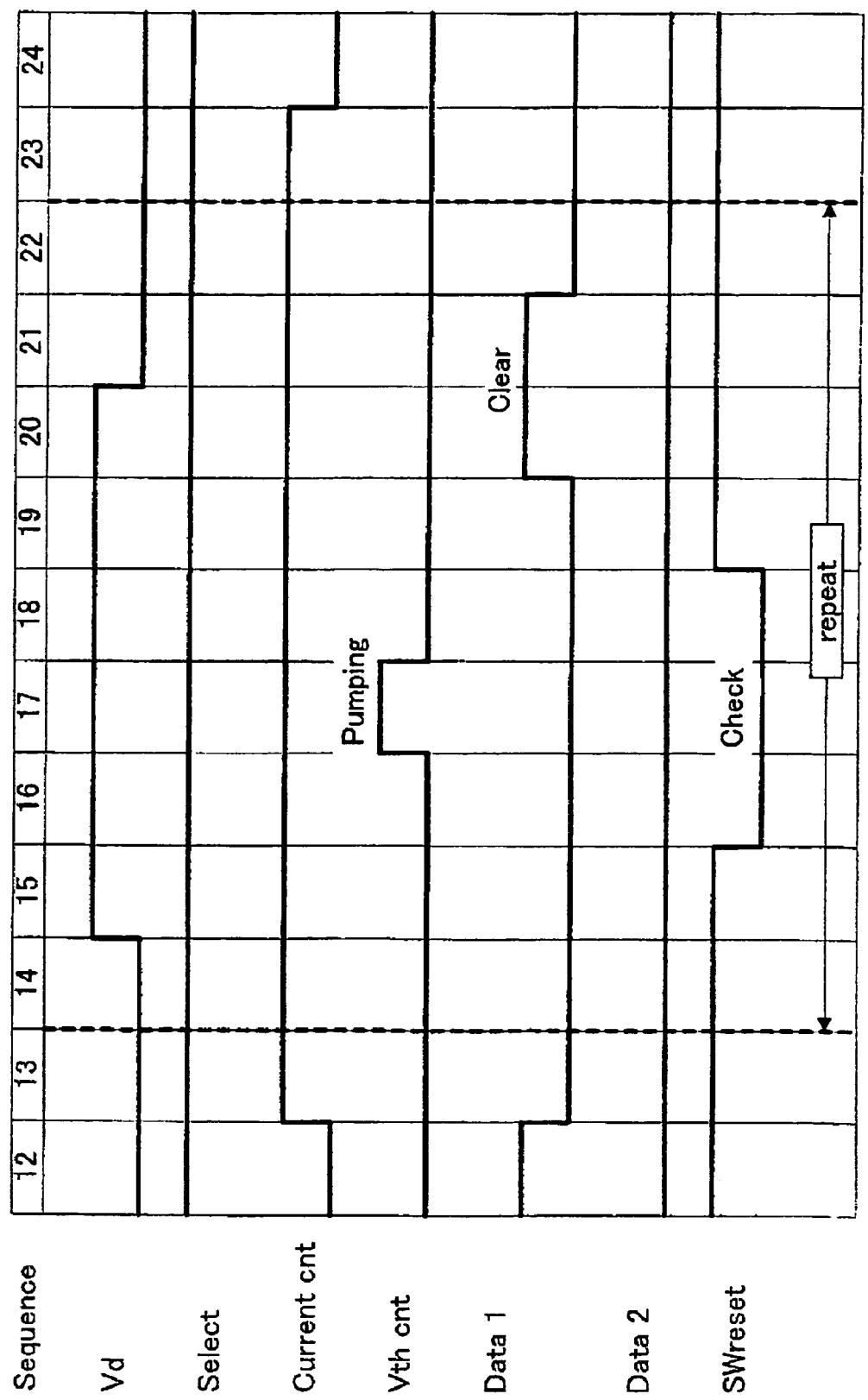
FIG. 18 is a view showing driving waveforms in a charge pumping operation.
Figure 19:
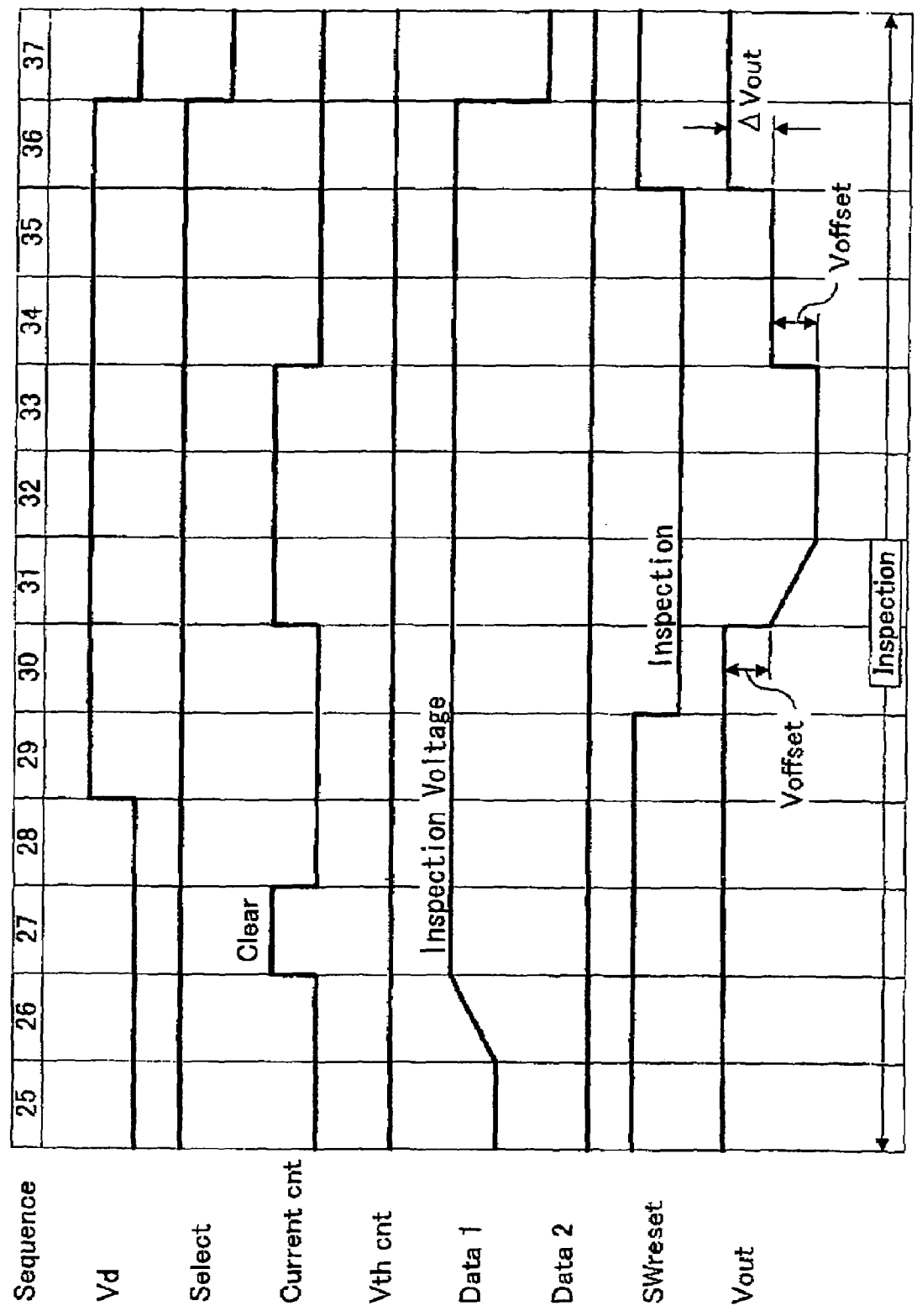
FIG. 19 is a view showing driving waveforms in an inspecting operation.

FIGS. 17 to 19 show driving waveforms subject to measurement, which represent a series of sequences continuously. All Select, Current cnt. and V cnt. of pixels above and under the pixels subject to inspection are turned off. Procedures for inspection can be classified broadly into an initializing operation (Initialize), a Vth writing operation (Vth Writing), a charge pumping operation (Charge Pumping), and an inspecting operation (Inspection). Judgment of a condition is performed as similar to the flowchart shown in FIG. 10.

FIG. 17 is a view showing the driving waveforms of the initializing operation (Sequences 1 to 4) and the Vth writing operation (Sequences 5 to 11).

(i) Initializing operation (Sequences 1 to 4)

Sequence 1: Initialize the pixel capacitor Cs1.

Sequence 3: Initialize the pixel capacitor Cs2.

(ii) Vth writing operation (Sequences 5 to 11)

Sequence 6: Select of the pixel subject to inspection is turned on.

Sequence 7: The gate voltage of the driving TFT is increased through the pixel capacitor Cs2 by writing a voltage value slightly smaller than the maximum value as data.

Sequence 9: When it is possible to apply a voltage equal to or higher than Vth to the gate of the driving TFT in Sequence 7, the electrode voltage of Cs2 can be set to Vth through the driving TFT by tuning the Vth cnt. on. In this event, an electric current is confirmed by the integration circuit. When no electric current is confirmed, the process moves to the charge pumping operation (Sequence 12) as a subsequent process. When the electric current is confirmed, the process moves to the inspecting operation (Sequence 25).

As described above, in this case, a fairly high data voltage is applied to the driving TFT of the pixel subject to measurement so as to open the Vth cnt. Accordingly, Vth is generated on the electrode on the gate side of the driving TFT of Cs2. Whether thre is an overflown current is observed by use of the integration circuit output Vout.

FIG. 18 is a view showing the driving waveforms in the charge pumping operation. Description will be made in accordance with the respective sequences.

Sequence 15: A voltage is applied to Cm by tuning Vd on.

Sequence 17: Vth cnt. is turned on so as to allow the electric charges of Cm to flow into the pixel capacitor Cs2. In this event, the driving TFT is turned on when charge pumping is completed (when Vth is written therein), and an electric current is confirmed by the integration circuit 130.

Sequence 20: The gate voltage of the driving TFT is increased by writing data. Meanwhile, Vd is turned off and a leak current from the driving TFT is used to set the electric potential of Cm back to GND.

Sequences 14 to 22 are repeated until the electric current is confirmed in Sequence 17. After the charge pumping operation is completed, the Vth writing operation (Sequences 5 to 11) is performed again. This operation reflects consideration for hysteresis of the driving TFT. There is a risk of deviation of values between the case of writing Vth by pumping from a low-voltage state and the case of writing Vth from a high-voltage state. Accordingly, the writing operation is performed again in order to write Vth from a high-voltage state, which is a normal operation. Thus, in the charge pumping operation, electric charges are accumulated in Cs2 through Cm by tuning Vd on and off. The driving TFT is turned ON when Vth is written in, and the electric current is confirmed accordingly.

FIG. 19 is a view showing the driving waveforms in the inspecting operation. Description will be made in accordance with the respective sequences.

Sequence 26: Immediately after the Vth writing operation, which is in the state where the data are written, a minute voltage is further written in for inspection.

Sequence 27: The electric potential of the capacitance Cm is reduced to GND.

Sequence 29: The voltage at Vd is applied to the capacitance Cm.

Sequence 31: Current cnt. is turned on and a transient current is supplied from Cm. In this event, the integration circuit output Vout is changed, and such an aspect can be confirmed. However, the offset voltage corresponding to the change in Current cnt. is generated by turning on Current cnt. Since the constant current flows in the saturated region of the driving TFT, Vout is changed by the constant inclination.

Sequence 32: When the voltage of Cm is reduced below the pinch-off voltage of the driving TFT, the electric current is stopped and Vout becomes flat.

Sequence 34: When Current cnt. is turned off, the offset voltage of Current cnt. disappears.

Sequence 36: Measurement is completed.

In this way, when the minute voltage is additionally applied to the state where Vth is written in, the aspect of the electric current is confirmed from the integration circuit output.

The following calculations are executed by use of an integration circuit output waveform which is obtained by the procedures described above.

[Estimation of the Capacitance Cm]

A potential difference ($\Delta$ Vout) of Vout between Sequences 35 and 36 in FIG. 19 represents the charge amount (Qa) which flew from Cm.

$$Qa = \Delta Vout * Ci$$

where, Ci is the capacitor of the integration circuit 130. Meanwhile, after discharge in Sequence 27, Cm is charged by the voltage Vd in Sequences 29 to 32. Therefore, it is possible to estimate the capacitance Cm by calculating the following equation:

$$Cm = Qa/Vd$$

[Estimation of the Pinch-Off Voltage Vp]

The inclination changing point as shown in FIG. 9 is obtained from the output of the integration circuit 130, and electric potential set back from Vout by $\Delta$Vout in Sequence 33 is defined as a measurement reference voltage. When a potential difference ($\Delta$ Voutp) between this measurement reference voltage and the voltage at the inclination changing point is obtained (this is an operation for eliminating the electric charges which generate Voffset and thereby considering only the electric charges from Cm), the pinch-off voltage Vp can be estimated by:

$$Vp = Vd - \Delta Voutp * Ci/Cm$$

Unevenness in Vp in the panel can be evaluated by obtaining this value for every pixel.

[Estimation of the Vgs-Id Characteristic]

Unevenness in driving currents at a certain Vgs value can be evaluated by obtaining the inclination of Vout in Sequence 31. When a plurality of the minute potential values for application are selected in Sequence 26, a plurality of Id corresponding to Vgs are obtained. By comparing the plurality of Id with respect to all the pixels, it is possible to evaluate unevenness in characteristics among the driving TFTs.

[Estimation of Vth]

Moreover, when a correlation between the applied voltage and Vgs of the driving TFT is clear, it is possible to obtain an absolute value of Vth from the pinch-off voltages and the applied voltages thereof. Particularly, when the applied voltage and Vgs are deemed to be in proportion, Vth is obtained as follows:

$$Vth = (Vdata1 * Vp1 - Vdata2 * Vp2)/(Vdata1 - Vdata2)$$

Here, Vdata1 and Vdata2 are voltages applied to Data, and Vp1 and Vp2 are pinch-off voltages at the respective applied voltages.

In this way, it is possible to estimate Vth and the Vgs-Id characteristic for each pixel, and to judge an effect of the Vth compensation circuit, for example. By identifying the Vth value and the Vgs-Id characteristic for each pixel, it is possible to identify a pixel having a defect as compared to a predetermined design value prior to forming the OLED. As a result, it is possible to recognize unevenness in the active matrix OLED panels, and to remove an inappropriate panel prior to forming the OLED.

Here, by estimating the minute capacitance Cm for every pixel in the panel and evaluating the unevenness thereof, it is possible to specify a defective part in patterned pixel electrodes (electrodes connected to the drain side of the driving TFTs) and to identify the type of defect (improper formation of the pixel electrode or a short circuit between adjacent pixels). In other words, it is also possible to judge a defect of the pixel electrode in itself by learning a discontinuous portion of the minute capacitance Cm.

Figure 20:
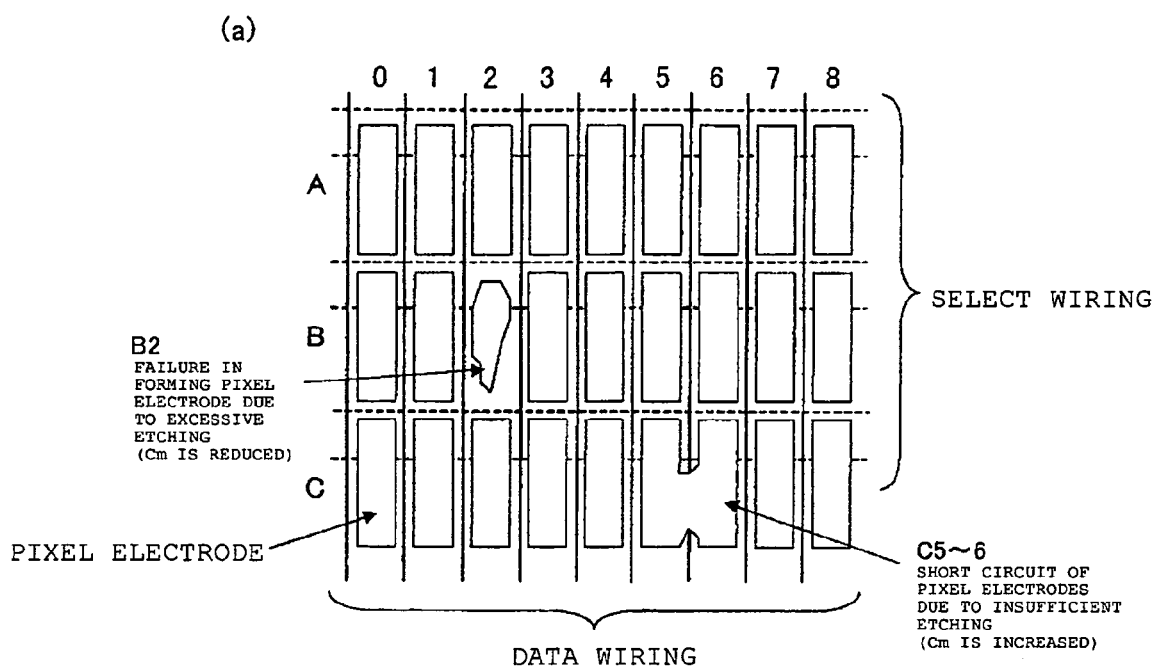
FIGS. 20A and 20B are views for explaining an example of defects attributable to predicted defective etching of pixel electrodes and an example of estimation of the minute capacitance Cm, respectively.

FIGS. 20A and 20B are views for explaining an example of predicted defects attributable to defective etching of pixel electrodes and an example of estimation of the minute capacitance Cm, respectively. FIG. 20A represents the example of predicted defects of pixel electrodes, which illustrates an example of failure in forming a pixel electrode due to excessive etching (a pixel electrode B2) and an example of a short circuit between adjacent pixel electrodes due to insufficient etching (pixel electrodes C5 and C6).

FIG. 20B shows an example of minute capacitance Cm values which are estimated with respect to 27 pixel electrodes in a matrix defined by A to C on the select wiring side and 0 to 8 on the data wiring side shown in FIG. 20A. In the example shown in FIG. 20B, an estimated Cm value when the area of the pixel electrode coincides with the design value is equal to 2.0. Whereas unevenness in the Cm values is caused depending on the distance between the electrode to be approximated to the TFT array substrate and the pixel electrode, it is predicted that the unevenness has a gentle variation. The example of FIG. 20B shows the aspect that the Cm values become uneven gently within a predetermined range from 1.9 to 2.1. In a first defective part (the pixel electrode 2B) shown in FIG. 20A, the Cm value exceeds the predetermined range because the area of the pixel electrode is too small. Accordingly, The Cm value therein is discontinuously smaller than the Cm values of the adjacent pixels. In this way, it is possible to identify the defect attributable to excessive etching. On the contrary, in a second defective part (the pixel electrodes C5 and C6) of FIG. 20A, the Cm value exceeds the predetermined range because the two pixel electrodes are connected together. Accordingly, The Cm value therein is discontinuously larger than the Cm values of the adjacent pixels. In this way, it is possible to identify the defect attributable to a short circuit. As described above, it is possible to specify the defective part and to identify the type of the defect by estimating the minute capacitance Cm and evaluating the unevenness therein.

As described above in detail, according to this embodiment, the counter electrode 18 to be connected to the power source is disposed in the vicinity of the surface of the AMOLED panel (the plane where the OLED connection electrode is exposed), and the minute capacitance Cm is formed between the drain of the driving TFT and the power source. Moreover, the transient current is passed through the drain and the source of the driving TFT through the minute capacitance Cm by changing the power supply voltage by the potential difference Vd. Thereafter, Vth of the driving TFT is estimated by observing the current waveform which is outputted from the driving TFT. Here, as the method of estimating Vth of the driving TFT, the known Vgs value is set and the transient current is supplied as described above, and the charge amount that flew is observed by use of the integration circuit 130 disposed on the source side of the driving TFT. Thereafter, the charge amount Qa at the point of pinch-off is obtained and the pinch-off voltage Vp is obtained from the minute capacitance Cm and the potential difference Vd. Accordingly, it I s possible to estimate Vth from the voltage Vgs between the gate and the source. Moreover, this embodiment is configured to estimate Vth after the accurate Cm value is obtained from the potential difference Vd between the total charge amount Qa flowing on the driving TFT, which is obtained by the integration circuit, and the minute capacitance Cm.

Moreover, in this embodiment, a so-called charge pump circuit is formed by use of the pixel capacitor Cs existing in the pixel circuit and the minute capacitance Cm, and Vth is stored in the capacitor Cs by raising Vgs of the driving TFT to the voltage higher than Vth and then discharging the electric charges of the pixel capacitor Cs through the driving TFT, and the pinch-off voltage Vp after Vth compensation is thereby estimated. In this event, the data line (wiring for gradation setting) is driven so as to activate the Vth compensation circuit during the period when the power source connected to the minute capacitance Cm is being changed to allow Vgs to become close to the voltage for turning on the driving TFT and simultaneously to turn off the driving TFT, and then the data line is driven so as to stop the Vth compensation circuit during the period when the power source is changed reversely to the foregoing and simultaneously to turn on the driving TFT. The above-described procedures of driving the data line are repeated to generate the voltage exceeding Vth at the pixel capacitor Cs.

Here, as the method of estimating the pinch-off voltage Vp of the driving TFT, the transient current is supplied after storing Vth in the pixel capacitor Cs, then the charge amount that flew is observed by use of the integration circuit 130 prepared on the source side of the driving TFT. Then the charge amount Qp at the point of pinch-off is obtained, and then the pinch-off voltage Vp is estimated from the minute capacitance Cm and the potential difference Vd. In this event, the pinch-off voltage Vp is estimated as described above after the accurate Cm value is obtained from the potential difference Vd between the total charge amount Qa flowing on the driving TFT, which is obtained by the integration circuit 130, and the minute capacitance Cm.

In this way, Vth or the pinch-off voltage Vp is obtained for every pixel on the active matrix panel (the TFT array 100), and the quality of the panel is judged by use of the voltage range and unevenness thereof. In this event, when the pinch-off voltage Vp is 0 V, it is possible to judge the quality of the panel by writing the minute voltage into the pixel capacitor Cs and measuring the unevenness in the electric currents flowing on the driving TFT. Moreover, when the pinch-off voltage is 0 V, it is also possible to write a plurality of minute capacitance values in the pixel capacitor Cs and to obtain Vth from the pinch-off voltage Vp at each applied voltage and an applied voltage ratio.

Furthermore, by use of the integrated waveform obtained as described above, it is possible to evaluate unevenness in the characteristics of the driving TFTs by means of obtaining the saturation current (the inclination of the integrated waveform) when a certain Vgs value is applied to the driving TFT for every pixel on the panel. Here, an approximate expression of a drain current (Id) of the driving TFT in the saturated region is defined as:

$$Id = 0.5 \beta \cdot (Vgs - Vth)^2$$

provided that, $$\beta = \mu \cdot Cox \cdot W/L;$$

μ: mobility (determined according to the process);

Cox: Capacitance per unit area between a gate and a channel; and

W/L: a ratio between a channel width and a channel length of the TFT.

This μ is determined by the process and the structure of the TFT, and is an important coefficient for deciding the size of Id. Therefore, by comparing the saturation currents, it is possible to perform inspection based on unevenness in β in addition to unevenness in Vth.

By adopting the configuration as described above, this embodiment becomes capable of measuring the threshold voltage Vth of the driving TFT and measuring the pinch-off voltage Vp of the driving TFT after the Vth compensation with respect to the TFT panel prior to mounting the OLED. In addition, it is possible to find the unevenness in the characteristics of the driving TFTs or the unevenness in the effects of Vth compensation circuits within the panel by carrying out the foregoing measurement for all the pixels in the panel. Moreover, it is possible to judge the quality of the panel by using this result. In this way, it is possible to substantially reduce an amount of defective products to be forwarded to a subsequent process. Accordingly, it is possible to reduce costs for manufacturing the panels. Moreover, reduction in development period is expected at a panel development phase by use of the test device shown in FIG. 2 for failure analysis.

Although this embodiment has been described on the example of using n-channel driving TFTs, the present invention is also applicable to the case where p-channel driving TFTs are used. When the p-channel driving TFTs are used, it is satisfactory if a non-inverting input (a positive input of the operational amplifier 131 shown in FIG. 8) of the integrated circuit 130 shown in FIG. 8 is changed from the GND to a power source (Vd).

As described above, according to the present invention, it is possible to carry out performance inspection of a TFT array for an AMOLED panel prior to a process for forming an OLED thereon. Accordingly, the present invention can substantially reduce costs for manufacturing panels.

Although the preferred embodiment of the present invention has been described in detail, it should be understood that various changes, substitutions and alternations can be made therein without departing from spirit and scope of the inventions as defined by the appended claims.

What is claimed is:

1. An inspection device for an active matrix panel comprising:
    a counter electrode disposed in the vicinity of a plane of an active matrix panel prior to formation of an organic light emitting diode, said plane being where an organic light emitting diode connection electrode is exposed;
    minute capacitance forming means for forming minute capacitance between the organic light emitting diode connection electrode of a driving thin film transistor constituting the active matrix panel and a power source by use of the counter electrode;
    inspecting means for inspecting the active matrix panel based on the minute capacitance formed by the minute capacitance forming means; and
    pinch-off voltage estimating means for configuring a charge pump circuit using a pixel capacitor existing in a pixel circuit and the minute capacitance and for estimating a pinch-off voltage after compensation of a threshold voltage.

2. An inspection method for an active matrix panel, comprising obtaining an active matrix panel configured to inspect an active matrix panel prior to formation of an organic light emitting diode, the method further comprising the steps of:
    disposing a counter electrode in the vicinity of a plane of the active matrix panel where an organic light emitting diode connection electrode is exposed;
    selecting a thin film transistor subject to measurement in the active matrix panel;
    setting a power source connected to the counter electrode to a driving potential and applying a given voltage between a drain and a source of a driving thin film transistor of the pixel subject to measurement; and
    measuring an electric current which flows on the driving thin film transistor of the pixel subject to measurement, estimating a minute capacitance to be formed between the counter electrode and the driving thin film transistor; and
    specifying a defective part in the active matrix panel based on the minute capacitance estimated.

3. The inspection method for an active matrix panel according to claim 2,
    wherein the step of specifying a defective part is configured to specify the defective part based on judgment as to whether the minute capacitance estimated exceeds a predetermined range.

4. The inspection method for an active matrix panel according to claim 2, further comprising the steps of:
    estimating a threshold voltage of the driving thin film transistor; and
    specifying a defective part in the active matrix panel based on the estimated threshold voltage.

5. The inspection method for an active matrix panel according to claim 4,
    wherein the step of estimating a threshold voltage is configured to measure a charge amount that flew by use of an integration circuit disposed on a source side of the driving thin film transistor, and to estimate the threshold voltage by obtaining a pinch-off voltage from the charge amount that the driving thin film transistor flew until reaching a pinch-off state.

6. The inspection method for an active matrix panel according to claim 5, further comprising the step of:
    obtaining any of the threshold voltage and the pinch-off voltage with respect to pixels constituting the active matrix panel and judging whether the active matrix panel is defective based on any of a voltage range and unevenness of any of the threshold voltage and the pinch-off voltage.

* * * * *